United States Patent
Iwashita

(10) Patent No.: US 7,469,393 B2
(45) Date of Patent: Dec. 23, 2008

(54) METHOD AND DEVICE FOR SUPPORTING VERIFICATION, AND COMPUTER PRODUCT

(75) Inventor: Hiroaki Iwashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 329 days.

(21) Appl. No.: 11/520,940

(22) Filed: Sep. 14, 2006

(65) Prior Publication Data

US 2007/0168894 A1    Jul. 19, 2007

(30) Foreign Application Priority Data

Jan. 16, 2006    (JP) .............................. 2006-007940

(51) Int. Cl.
*G06F 17/50* (2006.01)
(52) U.S. Cl. ............................................. 716/5; 716/4
(58) Field of Classification Search ................ 716/4–5, 716/18; 703/15, 22, 27
See application file for complete search history.

(56) References Cited

U.S. PATENT DOCUMENTS

2002/0138812 A1*    9/2002    Johannsen ...................... 716/5

OTHER PUBLICATIONS

Jun Yuan et al.; "Constraint Synthesis for Environment Modeling in Functional Verification"; Design Automation Conference 2003; pp. 296-299.

* cited by examiner

*Primary Examiner*—Paul Dinh
(74) *Attorney, Agent, or Firm*—Greer, Burns & Crain, Ltd.

(57) ABSTRACT

In a verification support device, a logical expression expressing an operation of a pattern generator can be acquired. The pattern generator includes a basic pattern generator, priority pattern generators, priority pattern selection conditions, and selector circuits. The selector circuits connect the basic pattern generator, the priority pattern generators, and the priority pattern selection conditions. Output of the basic pattern generator and outputs of the priority pattern generators are respectively connected to a signal input of a corresponding selector circuit. Outputs of the priority pattern selection conditions are connected to an ON/OFF control input of each selector circuit. An n-th selector circuit, among all selector circuits, is connected to an input terminal of a verification subject.

19 Claims, 13 Drawing Sheets

METHOD AND DEVICE FOR SUPPORTING VERIFICATION, AND COMPUTER PRODUCT

CROSS-REFERENCE TO RELATED APPLICATIONS

This application is based upon and claims the benefit of priority from the prior Japanese Patent Application No. 2006-007940, filed on Jan. 16, 2006, the entire contents of which are incorporated herein by reference.

BACKGROUND OF THE INVENTION

1. Field of the Invention

The present invention relates to a technology for supporting hardware logic verification.

2. Description of the Related Art

Conventionally, a hardware module is generally configured to operate normally when an input pattern provided in a specification is received. If an input pattern that is not originally permitted is received, no operation is specified. Therefore, when a logic simulation is performed for each module, the input pattern to be input into the module should be one provided in the specification. Otherwise, a significant simulation result cannot be obtained.

The input pattern can be created using a pattern manually created in advance. The input pattern can also be created using a pattern generator that dynamically and automatically generates a pattern while performing a simulation. Furthermore, the input pattern can be created using a combination of the manually-created pattern and the pattern generator.

Ordinarily, the pattern generator is manually created using a language, such as C programming language, SystemC language, Verilog language, and very high speed integrated circuit (VHSIC) hardware description language (VDHL). Moreover, in recent years, a technology that automatically generates the pattern generator from a description related to a formal input-restriction condition has also become known (for example, in Proc. of the Design Automation Conference 2003, pp. 296 and 299, 2003, titled "Constraint Synthesis for Environment Modeling in Functional Verification" by J. Yuan, Ken Albin, Adnan Aziz, and Carl Pixley). The input-restriction condition is a condition that must be always satisfied by an input sent to a hardware module to be verified.

FIG. 14 is a schematic of a hardware module to be verified. A verification subject 1400 is a sequential circuit. clk is a clock input. The verification subject 1400 has 1-bit inputs cmd and req, a 1-bit output ack, a 32-bit input wd, and a 32-bit output rd. Following input-restriction conditions apply to the inputs of the verification subject.

When cmd=0 and req=1 are input, a Read operation starts. Values of cmd and req cannot be changed until the Read operation is completed by a response of ack=1.

When cmd=1 and req=1 are input, a Write operation starts. Values of cmd, req, and wd cannot be changed until the Write operation is completed by a response of ack=1.

As in the example above, the input-restriction conditions are generally dependent on not only input and output values that are input into and output from the verification subject 1400 at the current time, but also past input and output values. Therefore, a set-up that judges whether an input restriction is followed is introduced.

FIG. 15 is a schematic of a model defining the input-restriction condition. In the example shown in FIG. 15, a modeling of the set-up used to judge whether the input restriction is followed is performed using a sequential machine $M_0$ and a logical expression $C_0$. The logical expression $C_0$ corresponds to the input-restriction condition. The sequential machine $M_0$ has a state variable s and a state variable t. The state variable s and the state variable t indicate an operation state of the verification subject 1400 (sequential circuit) and input and output values.

FIG. 16 is a schematic of a state transition graph expressing value changes of the state variable s. s=0 corresponds to an initial state. s=1 corresponds to a state during the Read operation. s=2 corresponds to a state during the Write operation. The state variable t always maintains a wd value of a cycle immediately prior to the present cycle. The input-restriction condition is expressed by the logical expression $C_0$ shown in a following Equation 1, using the state variable s and the state variable t of the sequential machine $M_0$, and the input and output values of the verification subject.

$$C_0 = (s=0) + (s=1) \cdot \overline{cmd} \cdot req + (s=2) \cdot cmd \cdot req \cdot (wd=t) \quad (1)$$

A pattern generator ($G_0$) can be automatically generated with the logical expression $C_0$ of the input-restriction condition as a starting point. FIG. 17 is a schematic of a pattern generator ($G_0$) automatically generated with the logical expression $C_0$ of the input-restriction condition as the starting point. The pattern generator ($G_0$) shown in FIG. 17 performs operations shown in following logical expressions 2 to 4.

$$cmd \leftarrow (s=1)?0:(s=2)?1:random(1) \quad (2)$$

$$req \leftarrow ((s=1)+(s=2))?1:random(1) \quad (3)$$

$$wd \leftarrow (s=2)?t:random(32) \quad (4)$$

A logical expression "x?y:z" is a ternary operation having a value y when a condition x is met and a value z when the condition x is not met, and is equivalent to a following logical expression 5. "random(n)" is a function that generates a random value having a bit width of n. For example, in the logical expression 4, wd has a value t when the verification subject is performing the Write operation. wd has a random value of 32 bits when the verification subject is not performing the Write operation.

$$x?y:z \quad (5)$$

An input group input into the verification subject include $\langle y \rangle = (y1, y2, \ldots, yn)$ of n bits. A group of other variables (the outputs output from the verification subject and the state variables of the sequential machine added to the verification subject) includes $\langle x \rangle = (x1, x2, \ldots, xm)$ of m bits. $\langle x \rangle$ and $\langle y \rangle$ are respectively vectors formed using the variables within the parentheses.

The logical expression provided as an input restriction is equivalent to a logical function f of $\langle x \rangle$ and $\langle y \rangle$. Therefore, a target pattern generator ($G_0$) can be configured as follows:

$$y_1 \leftarrow g_1(\vec{x}, r_1)$$
$$y_2 \leftarrow g_2(\vec{x}, r_1, r_2)$$
$$\vdots$$
$$y_n \leftarrow g_n(\vec{x}, r_1, r_2, \ldots, r_n)$$

$r_1, r_2, \ldots, r_n$ are newly introduced logical variables randomly having a value of 1 or 0. A logical function group $g_1, g_2, \ldots, g_n$ is determined by following procedures [1] to [5].

[1] Under an assumption that $y_2, \ldots, y_n$ are set to appropriate values of some sort, a simplified restriction condition is determined. The restriction condition is expressed by Equation 6.

$$f(\vec{x}, y_1) = \exists (y_2, \ldots, y_n) \cdot f(\vec{x}, \vec{y}) \tag{6}$$

[2] A condition in which a value 0 can be output to $y_1$ and a condition in which a value 1 can be output to $y_1$ are determined by an assignment of a constant to Equation 6. Using the conditions, a logical function $g_1$ in Equation 7 below, is configured to have the value 0 when 0 can be output but 1 cannot be output to $y_1$, the value 1 when 1 can be output but 0 cannot be output to $y_1$, and a value equivalent to the random value $r_1$ in other instances.

$$g_1(\vec{x}, r_1) = f(\vec{x}, 0) \cdot \overline{f(\vec{x}, 1)} ? 0 : \overline{f(\vec{x}, 0)} \cdot f(\vec{x}, 1) ? 1 : r_1 \tag{7}$$

[3] The value of the logical function $g_1$ in Equation 7 is used as $y_1$. Under an assumption that $y_3, \ldots, y_n$ are set to appropriate values of some sort, a simplified restriction condition is determined. The restriction condition is expressed by Equation 8.

$$f'(\vec{x}, r_1, y_2) = \exists (y_3, \ldots, y_n) \cdot f(\vec{x}, g_1(\vec{x}, r_1), y_2, y_3, \ldots, y_n) \tag{8}$$

[4] A new logical function $g_2$ is determined using a same procedure as in [2]. The logical function $g_2$ is expressed by Equation 9.

$$g_2(\vec{x}, r_1, r_2) = f'(\vec{x}, r_1, 0) \cdot \overline{f'(\vec{x}, r_1, 1)} ? 0 : \overline{f'(\vec{x}, r_1, 0)} \cdot f'(\vec{x}, r_1, 1) ? 1 : r_2 \tag{9}$$

[5] Subsequent logical functions up to a logical function $g_n$ are determined using the same procedure. A $\exists v.f$ operation accurately determines "a condition related to remaining variables to allow an existence of an assignment of a value to v in which a value of the logical function f is 1". When a variable vi is a one-bit logical variable, an $\exists$ operation is defined as follows:

$$\exists v_i \cdot f(v_1, \ldots, v_i, \ldots, v_n) = \tag{10}$$
$$f(v_1, \ldots, 0, \ldots, v_n) + f(v_1, \ldots, 1, \ldots, v_n)$$

When the variable $v_i$ is a multiple value variable having a set of values V, an $\exists$ operation is defined as follows:

$$\exists v_i \cdot f(v_1, \ldots, v_i, \ldots, x_v) = \sum_{a \in V} f(v_1, \ldots, a, \ldots, v_n) \tag{11}$$

An $\exists$ operation related to a variable group $(y_1, \ldots, y_m)$ is defined as follows:

$$\exists \vec{y}.f = \exists_{y_1} \ldots \exists_{y_m} f \tag{12}$$

It is widely known that the $\exists$ operation can be effectively executed by a calculator using a technology, such as a binary decision diagram (BDD). When a logical expression including a multiple-bit input variable, such as wd in Equation 1, is the starting point, the logical expression is used after being rewritten into, for example, Equation 13. Equation 13 is divided into each bit.

$$C_0 = (s=0) + (s=1) \cdot \overline{cmd} \cdot req + \tag{13}$$
$$(s+2) \cdot cmd \cdot req \cdot (wd[31] = t[31]) \ldots (wd[0] = t[0])$$

Alternatively, as a different method, a one-bit variable wd_t can be introduced and the logical expression can be rewritten as follows. The one-bit variable wd_t indicates that a wd=t relationship is established.

$$C_0 = (s=0) + (s=1) \cdot \overline{cmd} \cdot req + (s=2) \cdot cmd \cdot req \cdot wd\_t \tag{14}$$

Examples in which the logical functions $g_1$, $g_2$, and $g_3$ are determined with Equation 6 as the starting point are shown in [1] to [6] below. The logical functions $g_1$, $g_2$, and $g_3$ are equivalent to the right-hand sides of Equations 2 to 4 above.

[1] Under an assumption that req and wd_t are set to appropriate values of some sort, a simplified restriction condition f'(s, cmd) is determined. The restriction condition f'(s, cmd) is expressed by Equation 15.

$$f'(s, cmd) = \exists (req, wd\_t) \cdot ((s=0) + (s=1) \cdot \overline{cmd} \cdot req + \tag{15}$$
$$(s=2) \cdot cmd \cdot req \cdot wd\_t)$$
$$= (s=0) + (s=1) \cdot \overline{cmd} + (s=2) \cdot cmd$$

[2] A condition f'(s, 0) in which a value 0 can be output to cmd and a condition f'(s, 1) in which a value 1 can be output to cmd are determined by an assignment of a constant to the restriction condition f'(s, cmd). Using the conditions, a logical function g1 (s, r1) is configured to have the value 0 when 0 can be output but 1 cannot be output to cmd, the value 1 when 1 can be output but 0 cannot be output to cmd, and a value equivalent to the random value r1 in other instances. The condition f'(s, 0), the condition f'(s, 1), and the logical function $g_1(s, r_1)$ are expressed by Equations 16 to 18.

$$f'(s, 0) = (s=0) + (s=1) \tag{16}$$

$$f'(s, 1) = (s=0) + (s=2) \tag{17}$$

$$g_1(s, r_1) = f'(s, 0) \cdot \overline{f'(s, 1)} ? 0 : \overline{f'(s, 0)} \cdot f'(s, 1) ? 1 : r_1 \tag{18}$$
$$= (s=1) ? 0 : (s=2) ? 1 : r_1$$

[3] The value of the logical function $g_1(s, r_1)$ is used as cmd. Under an assumption that wd_t is set to an appropriate value of some sort, a simplified restriction condition f"(s, r1, req) is determined. The restriction condition f"(s, r1, req) is expressed by Equation 19.

$$f''(s, r_1, req) = \exists (wd\_t) \cdot ((s=0) + (s=1) \cdot \overline{g_1(s, r_1)} \cdot req + \tag{19}$$
$$(s=2) \cdot g_1(s, r_1) \cdot req \cdot wd\_t)$$
$$= \exists (wd\_t) \cdot ((s=0) + (s=1) \cdot req +$$
$$(s=2) \cdot req \cdot wd\_t)$$
$$= (s=0) + (s=1) \cdot req + (s=2) \cdot req$$

[4] A condition f"(s, r1, 0) in which a value 0 can be output to req and a condition f"(s, r1, 1) in which a value 1 can be output to req are determined by an assignment of a constant to the restriction condition f"(s, r1, req). Using the conditions, a logical function g2 (s, r1, r2) is configured to have the value 0 when 0 can be output but 1 cannot be output to req, the value 1 when 1 can be output but 0 cannot be output to req, and a value equivalent to a random value r2 in other instances. The condition f″(s, r1, 0), the condition f″(s, r1, 1), and the logical function g2 (s, r1, r2) are expressed by Equations 20 to 22.

$$f''(s, r_1, 0) = (s = 0) \quad (20)$$

$$f''(s, r_1, 1) = (s = 0) + (s = 1) + (s = 2) \quad (21)$$

$$g_2(s, r_1, r_2) = f''(s, r_1, 0) \cdot \overline{f''(s, r_1, 1)} ? 0 : \overline{f''(s, r_1, 0)} \cdot \quad (22)$$
$$f''(s, r_1, 1) ? 1 : r_2$$
$$= 0 ? 0 : ((s = 1) + (s = 2)) ? 1 : r_2$$
$$= ((s = 1) + (s = 2)) ? 1 : r_2$$

[5] A restriction condition f‴(s, $r_1$, $r_2$, wd_t) of when the value of the logical function $g_1$(s, $r_1$) is used as cmd and the value of the logical function $g_2$(s, $r_1$, $r_2$) is used as req is determined. The t) is expressed by Equation 23.☐ restriction condition f‴(s, r1, r2, wd $$f'''(s, r_1, r_2, \text{wd\_t}) = (s = 0) + (s = 1) \cdot \overline{g_1(s, r_1)} \cdot \quad (23)$$
$$g_2(s, r_1, r_2) + (s = 2) \cdot g_1(s, r_1) \cdot$$
$$g_2(s, r_1, r_2) \cdot \text{wd\_t}$$
$$= (s = 0) + (s = 1) + (s = 2) \cdot \text{wd\_t}$$

[6] A condition f‴(s, $r_1$, $r_2$, 0) in which a value 0 can be output to wd_t and a condition f‴(s, $r_1$, $r_2$, 1) in which a value 1 can be output to wd_t are determined by an assignment of a constant to the restriction condition f‴(s, $r_1$, $r_2$, wd_t). Using the conditions, a logical function $g_3$(s, $r_1$, $r_2$, $r_3$) is configured to have the value 0 when 0 can be output but 1 cannot be output to wd_t, the value 1 when 1 can be output but 0 cannot be output to wd_t, and a value equivalent to a random value $r_3$ in other instances. The condition f‴(s, $r_1$, $r_2$, 0), the condition f‴(s, $r_1$, $r_2$, 1), and the logical function $g_3$(s, $r_1$, $r_2$, $r_3$) are expressed by Equations 24 to 26.

$$f'''(s, r_1, r_2, 0) = (s = 0) + (s = 1) \quad (24)$$

$$f'''(s, r_1, r_2 1) = (s = 0) + (s = 1) + (s = 2) \quad (25)$$

$$g_3(s, r_1, r_2, r_3) = f'''(s, r_1, r_2, 0) \cdot f'''(s, r_1, r_2, 1) ? 0 : \quad (26)$$
$$\overline{f'''(s, r_1, r_2, 0)} \cdot f'''(s, r_1, r_2, 1) ? 1 : r_3$$
$$= 0 ? 0 : (s = 2) ? 1 : r_3$$
$$= (s = 2) ? 1 : r_3$$

The values of $g_1$ and $g_2$ are respectively assigned to cmd and req. cmd and req are one-bit variables. The values of the variables $r_1$ and $r_2$ are newly generated each time, using a random value generating function, random(1).

A 32-bit random value, excluding t, is assigned to the 32-bit variable wd based on $g_3$, when wd_t, namely the value of $g_3$, is 0. The value of t is assigned to the 32-bit variable wd as is when the value of $g_3$ is 1. An arbitrary 32-bit random value is assigned to the 32-bit variable wd when the value of $g_3$ is a random value. As a result, a logical expression $G_0$ (Equations 27 to 29 below) expressing an operation of the pattern generator ($G_0$) can be obtained.

$$\text{cmd} \leftarrow (s=1)?0:(s=2)?1:\text{random}(1) \quad (27)$$

$$\text{req} \leftarrow ((s=1)+(s=2))?1:\text{random}(1) \quad (28)$$

$$\text{wd\_t} \leftarrow (s=2)?t:\text{random}(32) \quad (29)$$

A creator of a logic verification environment is required to create or automatically generate an input pattern, taking into consideration a balance between following two different types of requests:

(i) targeting and testing a particular situation; and
(ii) testing as wide range of situations as possible.

For example, (i) is a request to prioritize coverage of a situation in which a design-error may be present, such as when an interruption or an exception handling occurs. (ii) is a request to discover ideas that are not ordinarily conceived.

An extremely large number of patterns are required to be created or automatically generated to meet the request (ii). A large number of patterns cannot be created manually. Therefore, ordinarily, patterns that can be created manually are limited to patterns for the request (i).

The large number of patterns can be automatically generated using a pattern generator. However, to meet the request (ii), not only is the number of required patterns large, but it is also important that distribution of the patterns cover a range provided in a specification. To create a pattern generator such as the above, specification information is required to be understood in detail and reflected in a configuration of the pattern generator.

However, many procedures are required to create the pattern generator, and many errors occur. In addition, many return procedures are required when there are changes in the specification or misinterpretations of the specification. Therefore, the request "(ii) testing as wide a range of situations as possible" cannot be met.

At the same time, when a conventional technology, such as that in "Constraint Synthesis for Environment Modeling in Functional Verification", is used, the pattern generator meeting the request (ii) can be automatically generated from a specification description (input restriction) without error. Furthermore, the changes in the specification and misinterpretations of the specification can be easily handled.

However, the conventional technology, such as that in "Constraint Synthesis for Environment Modeling in Functional Verification", does not include a set-up that takes into consideration the request (i). A sequence in which the patterns are generated is decided by a random number not intended by a user. Therefore, all input patterns cannot be tested by logic simulation in the current hardware design verification because the number of required patterns is too large.

In the current hardware design verification, control of the sequence in which the patterns are generated or control of the distribution of the generated patterns is important. The conventional technology, such as that in "Constraint Synthesis for Environment Modeling in Functional Verification", cannot control the sequence in which the patterns are generated or the distribution of the generated patterns. Therefore, the request "(i) targeting and testing a particular situation" cannot be met.

SUMMARY OF THE INVENTION

It is an object of the present invention to at least solve the above problems in the conventional technologies.

A computer-readable recording medium according to one aspect of the present invention stores therein a verification support program. The verification support program makes a computer execute acquiring a first logical expression expressing an input condition that an input to a verification subject is required to satisfy, and a second logical expression expressing a priority verification action that is selected with priority, from among verification actions for the verification subject; calculating a third logical expression expressing a priority condition based on the first logical expression and the second logical expression, the third logical expression expressing that an input in the priority verification action that satisfies the input condition is desired to be input to the verification subject; and constructing a pattern generator that selectively generates a basic pattern and a priority pattern of an input to the verification subject based on the first logical expression and the third logical expression, the basic pattern satisfying the input condition, the priority pattern satisfying the priority condition.

A verification support apparatus according to another aspect of the present invention includes an acquiring unit configured to acquire a first logical expression expressing an input condition that an input to a verification subject is required to satisfy, and a second logical expression expressing a priority verification action that is selected with priority, from among verification actions for the verification subject; a calculating unit configured to calculate a third logical expression expressing a priority condition based on the first logical expression and the second logical expression, the third logical expression expressing that an input in the priority verification action that satisfies the input condition is desired to be input to the verification subject; and a constructing unit configured to construct a pattern generator that selectively generates a basic pattern and a priority pattern of an input to the verification subject based on the first logical expression and the third logical expression, the basic pattern satisfying the input condition, the priority pattern satisfying the priority condition.

A verification support method according to still another aspect of the present invention includes acquiring a first logical expression expressing an input condition that an input to a verification subject is required to satisfy, and a second logical expression expressing a priority verification action that is selected with priority, from among verification actions for the verification subject; calculating a third logical expression expressing a priority condition based on the first logical expression and the second logical expression, the third logical expression expressing that an input in the priority verification action that satisfies the input condition is desired to be input to the verification subject; and constructing a pattern generator that selectively generates a basic pattern and a priority pattern of an input to the verification subject based on the first logical expression and the third logical expression, the basic pattern satisfying the input condition, the priority pattern satisfying the priority condition.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments of the present invention will be explained in detail below with reference to the accompanying drawings. Within the explanations, a symbol of a vector in an equation is described using angle brackets < >. For example, a vector x is described as <x>.

Figure 1:
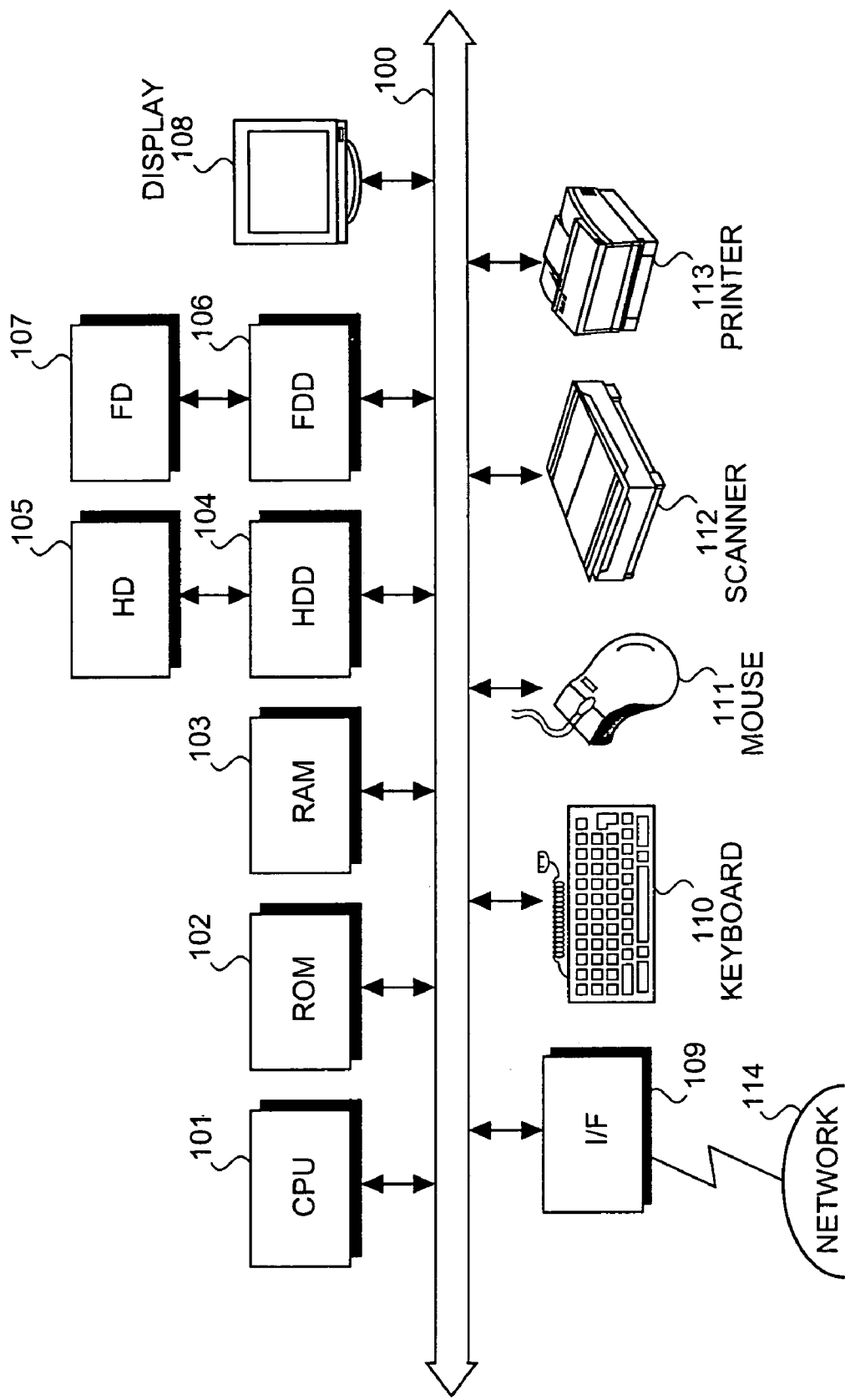
FIG. 1 is a schematic of a verification support device according to a first embodiment of the present invention.

FIG. 1 is a schematic of a verification support device according to a first embodiment of the invention. The verification support device includes a central processing unit (CPU) 101, a read-only memory (ROM) 102, a random-access memory (RAM) 103, a hard disk drive (HDD) 104, a hard disk (HD) 105, a flexible disk drive (FDD) 106, a flexible disk (FD) 107, a display 108, an interface (I/F) 109, a keyboard 110, a mouse 111, a scanner 112, and a printer 113. The FD 107 is an example of a removable recording medium. Each component is connected by a bus 100.

The CPU 101 controls the overall verification support device. The ROM 102 stores programs such as a boot program. The RAM 103 is used as a work area of the CPU 101. The HDD 104 controls reading and writing of data from and to the HD 105 under the control of the CPU 101. The HD 105 stores the data written under the control of the HDD 104.

The FDD 106 controls reading and writing of data from and to the FD 107 under the control of the CPU 101. The FD 107 stores the data written under the control of the FDD 106 and allows the verification support device to read the data stored in the FD 107.

Besides the FD 107, a compact-disc read-only memory (CD-ROM), a compact-disc recordable (CD-R), a compact-disc rewritable (CD-RW), a magneto optical (MO) disk, a digital versatile disk (DVD), a memory card, and the like can be used as the removable recording medium. The display 108 displays data, such as documents, images, and function information, in addition to a cursor, icons, and toolboxes. The display 108 can be, for example, a cathode-ray tube (CRT), a thin film transistor (TFT) liquid crystal display, or a plasma display.

The I/F 109 is connected to a network 114, such as the internet, via a communication circuit. The I/F 109 is connected to other devices via the network 114. The I/F 109 controls an interface between the verification support device and the network 114 and controls input and output of data from an external device. The I/F 109 can be, for example, a modem or a local area network (LAN) adapter.

The keyboard 110 includes keys for inputting characters, numbers, various instructions, and the like. The keyboard 110 performs data input. The keyboard 110 can also be a touch-panel-type input pad, a numeric keypad, or the like. The mouse 111 moves the cursor, selects a range, moves windows, changes window size, and the like. The mouse 111 can also be a track ball, a joystick, or the like, that similarly functions as a pointing device.

The scanner 112 optically reads an image and loads image data into the verification support device. The scanner 112 can have an optical character recognition (OCR) function. The printer 113 prints the image data and document data. The printer 113 can be, for example, a laser printer or an ink-jet printer.

Figure 2:
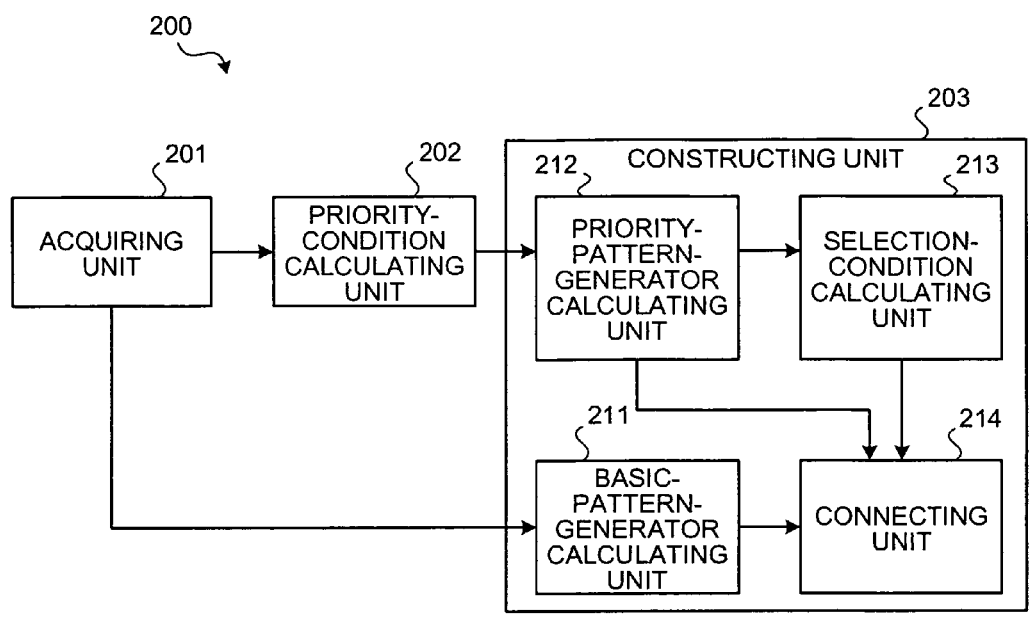
FIG. 2 is a block diagram of the verification support device according to the first embodiment.

FIG. 2 is a block diagram of the verification support device according to the first embodiment. A verification support device 200 includes an acquiring unit 201, a priority-condition calculating unit 202, and a constructing unit 203.

The acquiring unit 201 acquires a logical expression. Specifically, the acquiring unit 201 reads a logical expression created, for example, by a user. The logical expression to be read expresses, for example, an input-restriction condition ($C_0$). An input that is input into a verification subject is always required to satisfy the input-restriction condition ($C_0$). A following condition is given as an example of the input-restriction condition ($C_0$) for a verification subject 1400, shown in FIG. 14.

[Input-restriction condition ($C_0$)]:

When cmd=0 and req=1 are input, a Read operation starts. Values of cmd and req cannot be changed until the Read operation is completed by a response, ack=1.

When cmd=1 and req=1 are input, a Write operation starts. Values of cmd, req, and wd cannot be changed until the Write operation is completed by a response, ack=1.

Figure 14:
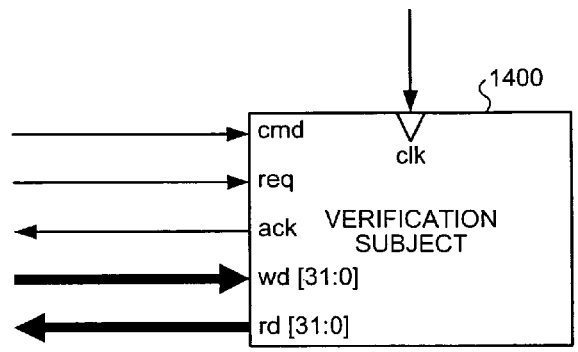
FIG. 14 is a schematic of a hardware module to be verified.
Figure 15:
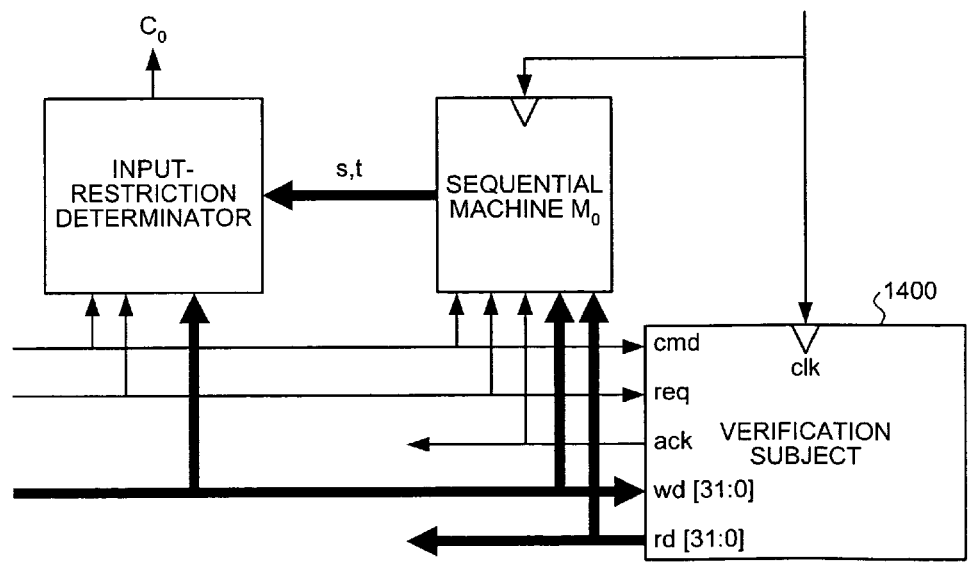
FIG. 15 is a diagram for explaining a model defining an input-restriction condition.
Figure 16:
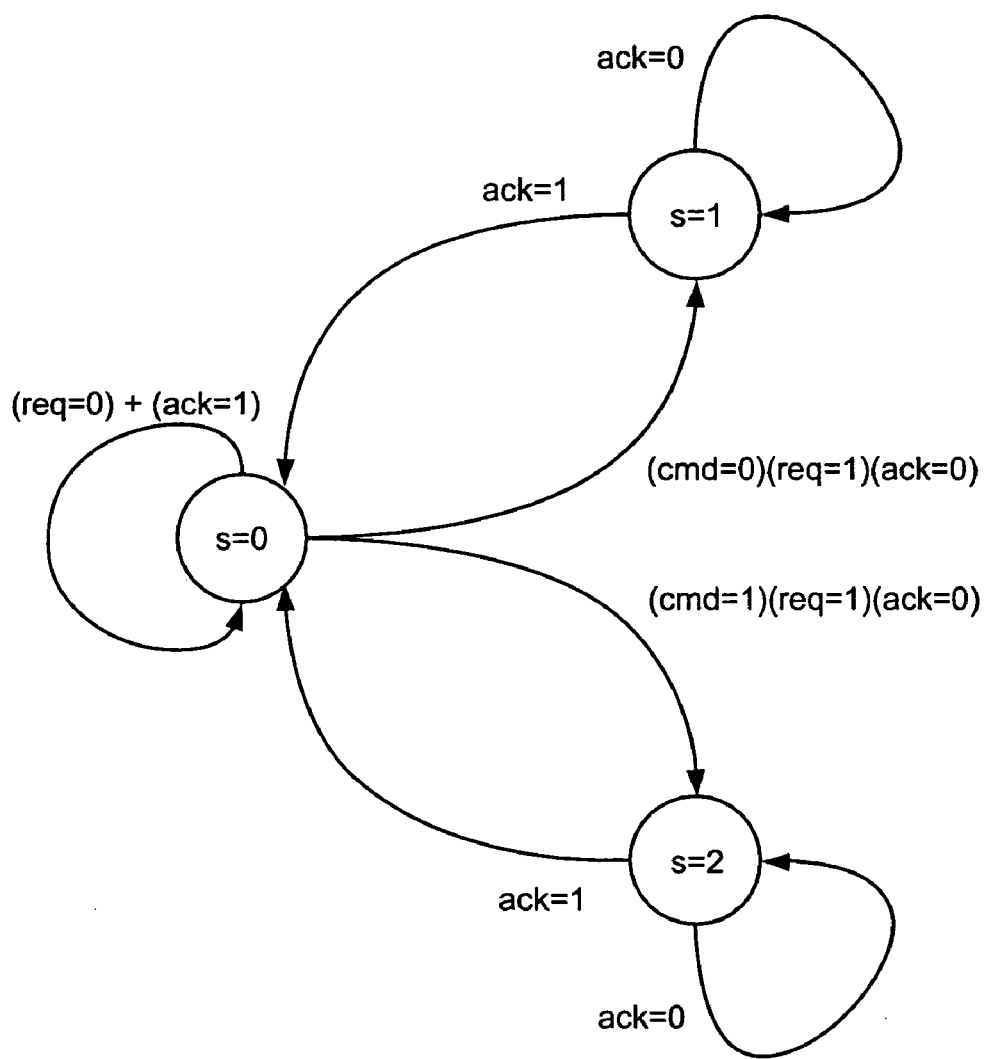
FIG. 16 is a schematic of a state transition graph expressing value changes of a state variable s.
Figure 17:
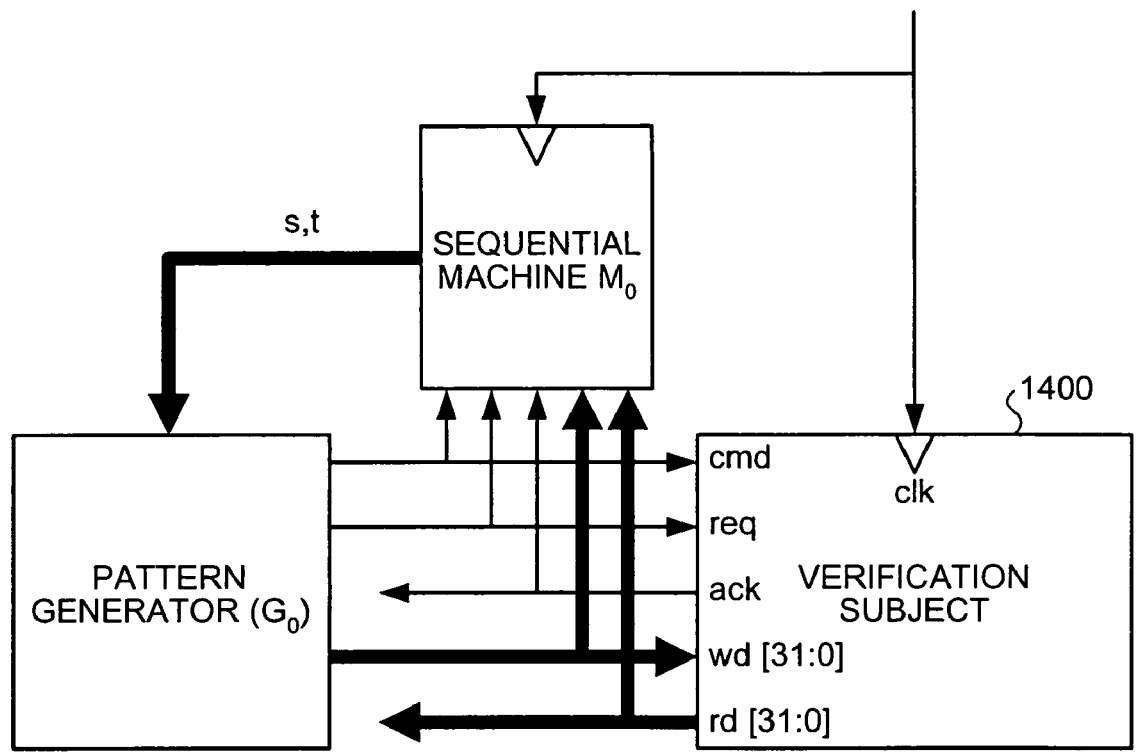
FIG. 17 is a schematic of a pattern generator (G0) automatically generated with a logical expression $C_0$ of an input-restriction condition as a starting point.

The logical expression expresses the input-restriction condition ($C_0$) above using a combination of a logical product and a logical sum of the inputs and outputs of the verification subject. The inputs input into the verification subject 1400, shown in FIG. 14, are cmd, req, and wd. The outputs are ack and rd. Therefore, the input-restriction condition ($C_0$) is expressed using the combination of the logical product and the logical sum of the inputs, cmd, req, and wd, and the outputs, ack and rd.

The logical expression expressing the input-restriction condition ($C_0$) may be dependent on past input and output values, in addition to current input and output values. In this case, the input-restriction condition can be expressed in combination with an appropriate finite state machine. The finite state machine performs a state transition while monitoring the inputs and outputs of the verification subject. Therefore, the logical expression expressing the input-restriction condition ($C_0$) includes the inputs and outputs of the verification subject and state variables of the finite state machine. Details of the logical expression are explained in Examples 1 and 2, hereafter.

In subsequent explanations, expression subjects of the logical expressions (for example, various conditions, actions, and various pattern generators) are given a reference symbol within parentheses ( ). In corresponding logical expressions, the reference symbols are used without the parentheses ( ) to correspond with a mathematical formula. For example, the input-restriction condition is expressed as "input-restriction condition ($C_0$)". Therefore, the logical expression of the input-restriction condition is expressed as $C_0$.

The acquiring unit 201 also acquires a logical expression $P_k$ that expresses a priority verification action ($P_k$). k is an integer (k=1 to n). The priority verification action ($P_k$) is a verification action that is given priority and selected among verification actions of the verification subject. A following condition is given as an example of the priority verification action ($P_k$) of the verification subject 1400, shown in FIG. 14. The priority verification action can be a single action (k=1) or a plurality of actions (k=2 to n). A logical expression $P_k$ that expresses the priority verification action ($P_k$) is written by the user.

[Priority verification action ($P_1$)]: testing when the Read operation or the Write operation is consecutively generated twice with no interval in between.

When there is a plurality of priority verification actions ($P_k$), the acquiring unit 201 acquires an order of priority for the priority verification actions ($P_k$) specified by the user. Usage of the order of priority will be explained hereafter. If a method disclosed in Japanese Patent Laid-open Publication No. 2004-235852 is used, the finite state machine and the input-restriction condition can be automatically generated from an interface specification description of a subject module. Therefore, in the present embodiment, the interface specification description can be a starting point, in place of the finite state machine and the input-restriction condition.

The priority-condition calculating unit 202 calculates a logical expression $C_k$ using the logical expressions $C_0$ and $P_k$, acquired by the acquiring unit 201. The logical expression $C_k$ expresses a priority condition ($C_k$). The priority condition ($C_k$) is for sending an input that satisfies the input-restriction condition ($C_0$) to the verification subject as the priority verification action.

Specifically, the priority-condition calculating unit 202 determines a logical product of the logical expression $C_0$ and the logical expression $P_k$, and calculates the logical expression $C_k$. The logical expression $C_0$ expresses the input-restriction condition ($C_0$). The logical expression $P_k$ expresses the priority verification action ($P_k$). The logical expression $C_k$ expresses the priority condition ($C_k$). When there is a plurality of logical expressions $P_k$ expressing the priority verification action ($P_k$), the logical expression $C_k$ expressing the priority condition ($C_k$) is calculated for each logical expression $P_k$ expressing the priority verification action ($P_k$).

The logical expression $C_k$ expressing the priority condition ($C_k$) is also expressed using the combination of the logical product and the logical sum of the inputs and outputs of the verification subject, as is the logical expression $C_0$ expressing the input-restriction condition ($C_0$). The inputs input into the verification subject 1400, shown in FIG. 14, are cmd, req, and wd. The outputs are ack and rd. Therefore, the logical expression $C_k$ is expressed using the combination of the logical product and the logical sum of the inputs, cmd, req, and wd, and outputs, ack and rd.

The logical expression $C_k$ expressing the priority condition ($C_k$) may be dependent on the past input and output values, in addition to the current input and output values. In this case, the priority condition ($C_k$) can be expressed in combination with the afore-described finite state machine. Therefore, the logical expression $C_k$ expressing the priority condition ($C_k$) includes the inputs and outputs of the verification subject and the state variables of the finite state machine.

In particular, the logical expression $C_k$ expressing the priority condition ($C_k$) can be expressed using an input group <y> input into the verification subject and a variable group <x>. The variable group <x> includes at least one of the outputs output from the verification subject and the state variables of the finite state machine.

Figure 3:
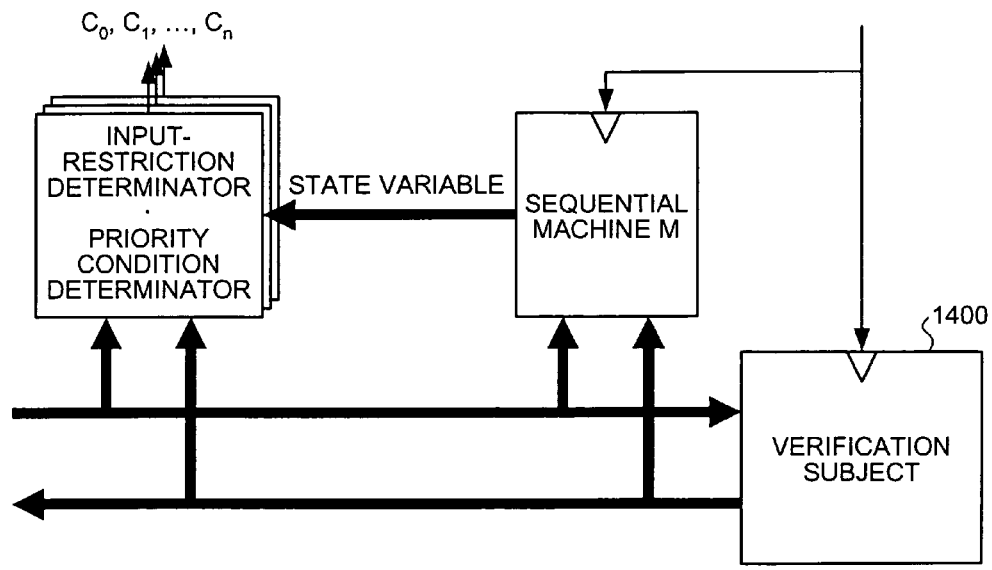
FIG. 3 is a schematic of a model defining an input-restriction condition ($C_0$) and a priority condition (Ck)

FIG. 3 is a schematic of a model defining the input-restriction condition ($C_0$) and the priority condition ($C_k$). A sequential machine $M_0$ is the finite state machine that performs a state transition while monitoring the inputs and outputs of the verification subject 1400.

When there are multiple priority verification actions ($P_k$) (for example, k=2) in FIG. 2, the priority-condition calculating unit 202 can calculate a logical product C1·C2 of the logical expression C1 and the logical expression C2. The logical expression C1 expresses the priority condition (C1) based on the priority verification action (P1). The logical expression C2 expresses the priority condition (C2) based on a priority verification action (P2). A priority condition (C1·C2) expressed by the logical product C1·C2 simultaneously satisfies the priority conditions ($C_1$) and ($C_2$) expressed by the two logical expressions $C_1$ and $C_2$.

The constructing unit 203 constructs a pattern generator (G) based on various logical expressions. Specifically, the constructing unit 203 constructs the pattern generator (G), based on the logical expression $C_0$ expressing the input-restriction condition ($C_0$) and the logical expression $C_k$ expressing the priority condition ($C_k$). The priority condition ($C_k$) is calculated by the priority-condition calculating unit 202. The pattern generator (G) selectively generates an input pattern (hereinafter, "basic pattern") input into the verification subject satisfying the input-restriction condition ($C_0$) and an input pattern (hereinafter, "priority pattern") input into the verification subject satisfying the priority condition ($C_k$).

A functional configuration of an interior of the constructing unit 203 will be explained. The constructing unit includes various calculating units. The calculating units calculate a new logical expression based on an input logical expression. Specifically, when the logical expression is input, the calculating units calculate the new logical expression using calculating methods (Equations 1 to 29) in "Constraint Synthesis for Environment Modeling in Functional Verification", explained above. The calculating units calculate the logical expression using the calculating methods above, unless otherwise stated.

A basic-pattern-generator calculating unit 211 calculates a logical expression $G_0$ expressing an operation of a basic pattern generator ($G_0$), based on the logical expression $C_0$ expressing the input-restriction condition ($C_0$). The basic pattern generator ($G_0$) generates the basic pattern. The basic pattern is the input pattern input into the verification subject satisfying the input-restriction condition ($C_0$). The basic-pattern-generator calculating unit 211 has the same functions as that in "Constraint Synthesis for Environment Modeling in Functional Verification".

A priority-pattern-generator calculating unit 212 calculates a logical expression $G_k$ expressing an operation of a priority pattern generator ($G_k$), based on the logical expression $C_k$ expressing the priority condition ($C_k$). The priority pattern generator ($G_k$) generates the priority pattern. The priority pattern is the input pattern input into the verification subject satisfying the priority condition ($C_k$). When there are multiple logical expressions $C_k$ expressing the priority condition ($C_k$), the logical expression $G_k$ expressing the operation of a priority pattern generator ($G_k$) is calculated for each logical expression $C_k$ expressing the priority condition ($C_k$).

A selection-condition calculating unit 213 calculates a logical expression $S_k$, based on the logical expression $C_k$ using the input group <y> input into the verification subject and the variable group <x>. The logical expression $S_k$ expresses a selection condition for a priority pattern specified by the variable group <x> when the priority condition ($C_k$) is met When value assignments of a logical variable <x> and a logical variable <y> are performed so that the value of the logical expression $C_k$ expressing the priority condition ($C_k$) is 1, the priority condition ($C_k$) is met. The pattern generator can only control the value of the logical variable <y>. Therefore, in some instances, the value of the logical expression $C_k$ cannot be 1 when the logical variable <x> is a certain value, regardless of the value of the logical variable <y>.

A condition of an opposite instance, namely a condition of the logical variable <x> when the value of the logical expression $C_k$ can be 1 by an appropriate selection of the logical variable <y>, is referred to as a priority pattern selection condition ($S_k$). The priority pattern selection condition ($S_k$) of the logical expression $C_k$ expressing the priority condition ($C_k$) can be calculated in the form of a logical expression, using an ∃ operation. The priority pattern selection condition ($S_k$) is expressed by Equation 30.

$$S_k(\vec{x}) = \exists \vec{y}. C_k(\vec{x}, \vec{y}) \tag{30}$$

The constructing unit 203 includes a connecting unit 214. The connecting unit 214 connects the outputs of the conditions and the pattern generators to a selector circuit, depending on the conditions and the pattern generators expressed by the input logical expressions. As a result, the pattern generators expressed by the input logical expressions are combined, and the pattern generator (G) that selectively generates the basic pattern and the priority pattern is constructed.

Figure 4:
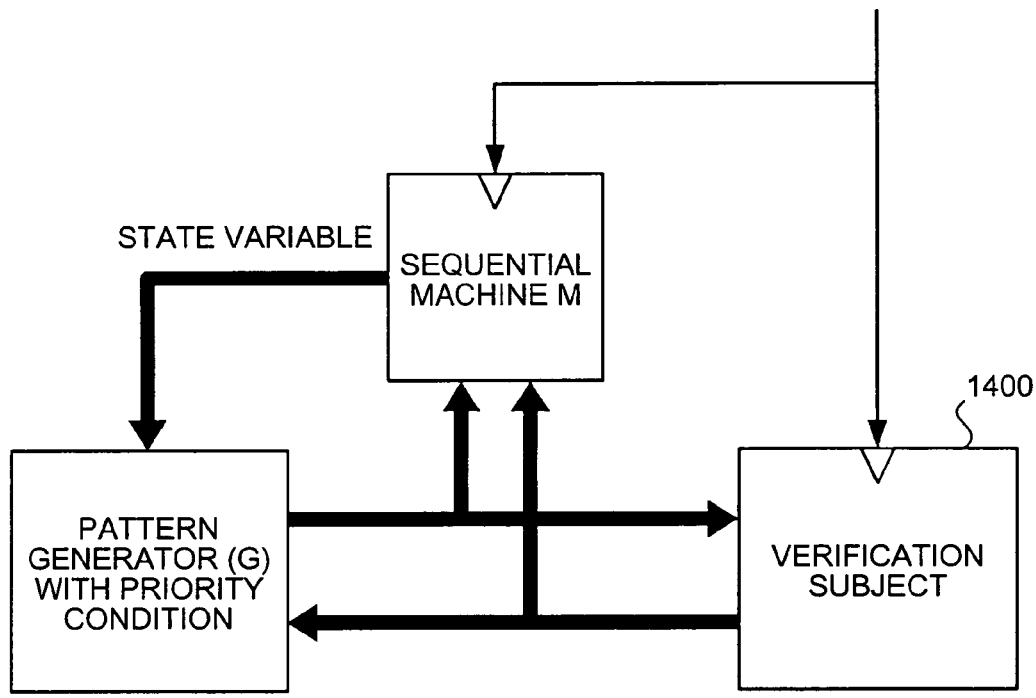
FIG. 4 is a schematic of a pattern generator (G) constructed by a constructing unit.
Figure 5:
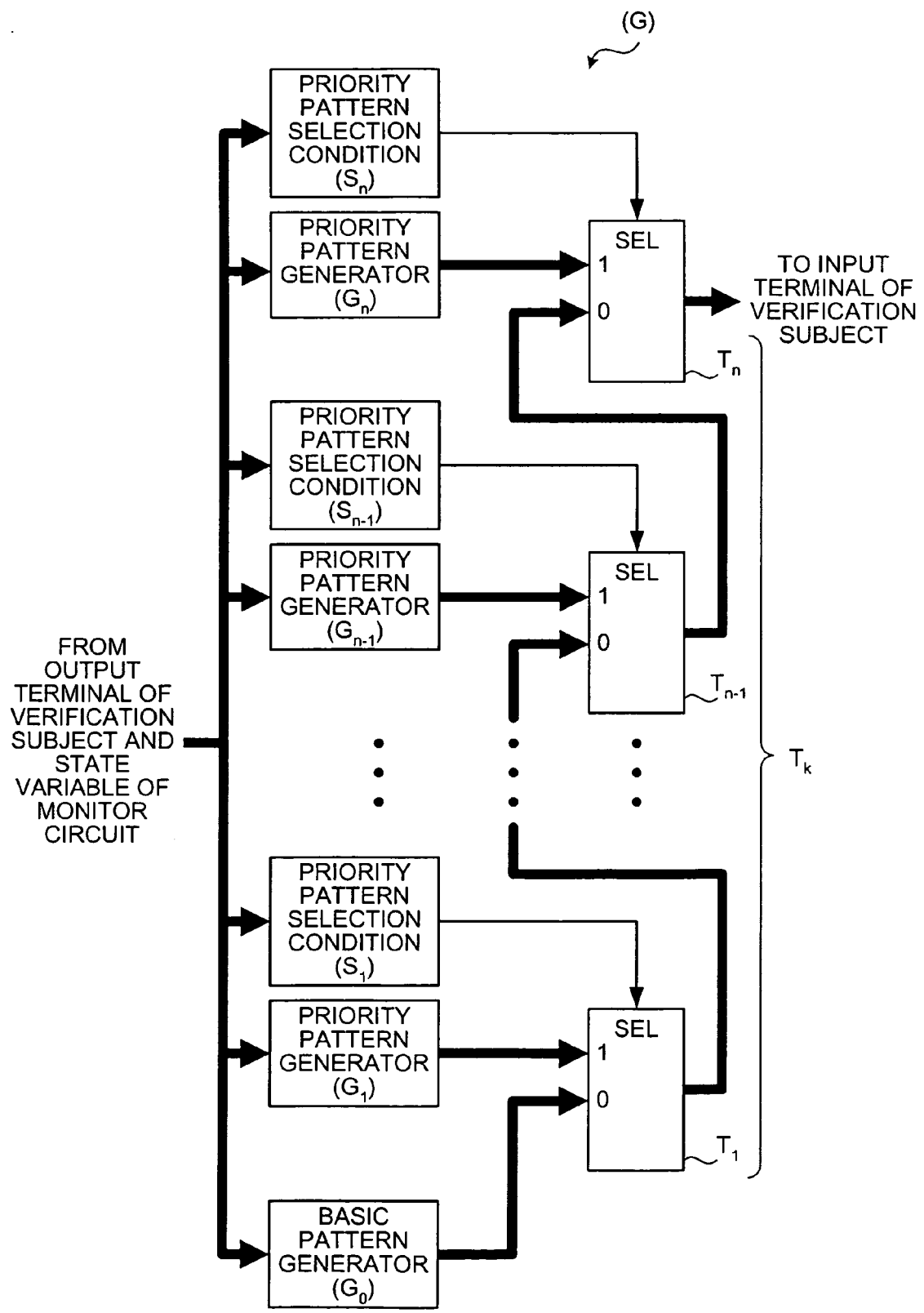
FIG. 5 is a schematic of an internal configuration of the constructed pattern generator (G)

FIG. 4 is a schematic of the pattern generator (G) constructed by the constructing unit 203. FIG. 5 is a schematic of an interior of the constructed pattern generator (G). The interior of the constructed pattern generator (G) includes the basic pattern generator ($G_0$), a k-number of priority pattern generators ($G_k$), a k-number of priority pattern selection conditions ($S_k$), and a k-number of selector circuits $T_k$. The selector circuits $T_k$ connect the basic pattern generator ($G_0$), the priority pattern generators ($G_k$), and the priority pattern selection conditions ($S_k$).

In FIG. 5, an output of the basic pattern generator ($G_0$) and outputs of the k-number of priority pattern generators ($G_k$) are respectively connected to a signal input of a corresponding selector circuit $T_k$. Outputs of the priority pattern selection conditions ($S_k$) are connected to an ON/OFF control input of each selector circuit $T_k$. An n-th selector circuit $T_n$, among all selector circuits $T_k$, is connected to an input terminal of the verification subject.

An n-th priority pattern generator ($G_n$) is directly connected the n-th selector circuit $T_n$ that is connected to the input terminal of the verification subject. Therefore, a priority pattern from the n-th priority pattern generator ($G_n$) becomes the most prioritized input pattern. In other words, the larger the value of k is, the higher the priority given to an output of the priority pattern from the priority pattern generator ($G_k$) is. The basic pattern from the basic pattern generator ($G_0$) has the lowest priority.

When there are multiple priority verification actions ($P_k$), a same number of logical expressions expressing the priority condition ($C_k$) are present. The same number of priority pattern selection conditions ($S_k$) are also present in correspondence with the logical expressions. Therefore, when the order of priority of the priority verification actions ($P_k$) specified by the user is acquired by the acquiring unit 201, the pattern generator (G) can be constructed to generate the priority patterns according to the order of priority. Specifically, the connections between the priority pattern generators ($G_k$) and the selector circuits $T_k$ can be changed according to the order of priority.

For example, when a priority pattern from a priority pattern generator ($G_n-1$) has a higher priority than the priority pattern from the pattern generator (Gn), the priority pattern selection condition (Sn) and a priority pattern selection condition (Sn−1) are interchanged. Furthermore, the priority pattern generator (Gn) and the priority pattern generator ($G_{n-1}$) are also interchanged. As a result, the patterns can be sent to the verification subject in the order specified by the user.

Specifically, functions of the acquiring unit 201, the priority-condition calculating unit 202, and the constructing unit 203 are actualized by the CPU 101 executing a program recorded in, for example, the ROM 102, the RAM 103, the HD 105, or the FD 107, shown in FIG. 1. Alternatively, the functions are actualized by the I/F 109.

Figure 6:
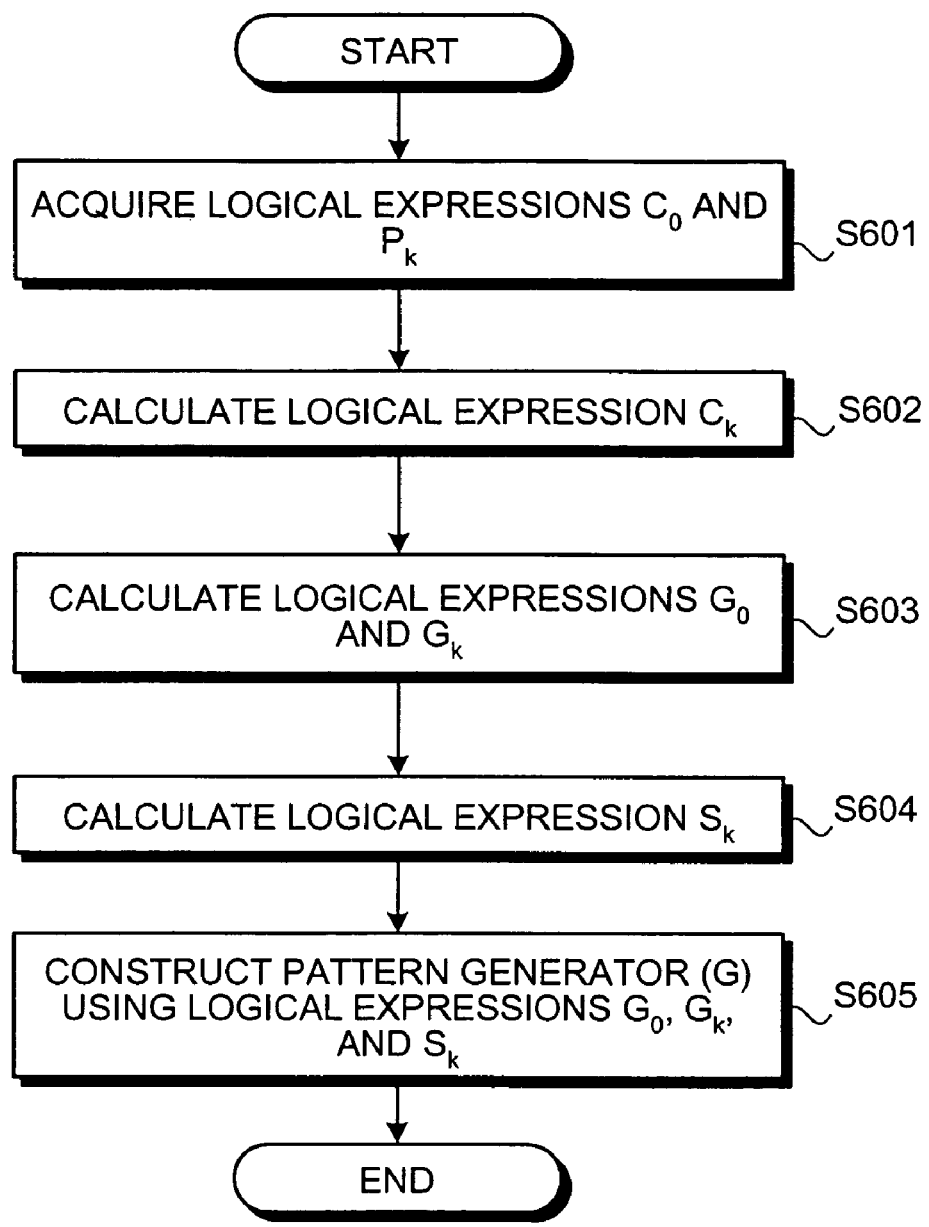
FIG. 6 is a flowchart of a verification support process performed by the verification support device according to the first embodiment.

FIG. 6 is a flowchart of a verification support process performed by the verification support device 200 according to the first embodiment. The acquiring unit 201 acquires the logical expression $C_0$ and the logical expression $P_k$ (Step S601). The logical expression $C_0$ expresses the input-restriction condition ($C_0$). The logical expression $P_k$ expresses the priority verification action ($P_k$). Next, the priority-condition calculating unit 202 calculates the logical expression $C_k$ using the logical expression $P_k$ (Step S602). The logical expression $C_k$ expresses the priority condition ($C_k$).

Then, the basic-pattern-generator calculating unit 211 calculates the logical expression $G_0$ using the logical expression $C_0$. In addition, the priority-pattern-generator calculating unit 212 calculates the logical expression $G_k$ using the logical expression $C_k$ (Step S603). The logical expression $G_0$ expresses the operation of the basic pattern generator ($G_0$). The logical expression $G_k$ expresses the operation of the priority pattern generator ($G_k$).

The selection-condition calculating unit 213 calculates the logical expression $S_k$ using the logical expression $C_k$ (Step S604). The logical expression $G_k$ expresses the priority pattern selection condition ($S_k$). Then, the connecting unit 214 connects the basic pattern generator ($G_0$), the basic pattern generator ($G_k$), and the priority pattern selection condition ($S_k$) to the selector circuit using the logical expressions $G_0$, $G_k$, and $S_k$, and constructs a pattern generator (G) with priority condition (Step S605).

The user cannot control the order in which the patterns are generated in the afore-described conventional technology. However, in the first embodiment, because the priority condition ($C_k$) is expressed by the logical expression, patterns can be placed in sequence so that a pattern that applies to the priority condition ($C_k$) is tested precedingly to other patterns, and the other patterns are tested in subsequent stages.

When a sequencing function is used, basic functions can be tested at an early stage and situations in which problems tend to occur can be intensively tested. As a result, efficiency of a logic verification operation can be significantly enhanced.

The process for generating the pattern generator is divided into processes for the input-restriction condition ($C_0$) and each priority condition ($C_k$). Therefore, cost of calculator memory usage and the like can be reduced. Each function in the constructed pattern generator (G) is clearly separated and can be reused by changing the order of priority by changing the configuration of the selector circuits automatically or manually.

An example of the first embodiment will be explained, below. A first example is when the pattern generator (G) with priority condition is constructed by a single priority verification operation, namely a single priority condition (k=1). At the same time, a second example is when the pattern generator (G) with priority condition is constructed by a plurality of priority verification actions, namely a plurality of priority conditions (k=2 to n).

In the first example, the input group input into the verification subject is an n-bit logical variable <y>=(y1, y2, . . . , yn). The group of other variables (the outputs output from the verification subject, the state variables of a sequential machine added to the verification subject, and the like) is an m-bit logical variable <x>=($x_1$, $x_2$, . . . $x_n$). The priority condition ($C_k$) is expressed by a logical expression $C_k$ including the logical variable <x> and the logical variable <y>.

When the values are assigned to the logical variable <x> and the logical variable <y> so that the value of the logical expression $C_k$ is 1, the priority condition is met. The pattern generator (G) can only control the logical variable <y>. Therefore, in some instances, the value of the logical expression $C_k$ cannot be 1 when the logical variable <x> is a certain value, regardless of the value of the logical variable <y>.

A condition of an opposite instance, namely a condition of the logical variable <x> when the value of the logical expression $C_k$ can be 1 by an appropriate selection of the logical variable <y>, is the above-described priority pattern selection condition ($S_k$). The priority pattern selection condition ($S_k$) of the logical expression $C_k$ expressing the priority condition can be generated using the ∃ operation shown in Equation 30, above.

The conventional technology in the "Constraint Synthesis for Environment Modeling in Functional Verification" explained above, can be used as the method used to automatically generate the pattern generator ($G_0$) from the logical expression $C_0$ of the input-restriction condition ($C_0$) and the like. A pattern generator generating process when a following priority condition is added to the verification subject 1400, shown in FIG. 14, is shown as a specific example.

[Priority condition ($C_1$)]: testing when the Read operation or the Write operation is consecutively generated twice with no interval in between.

Figure 7:
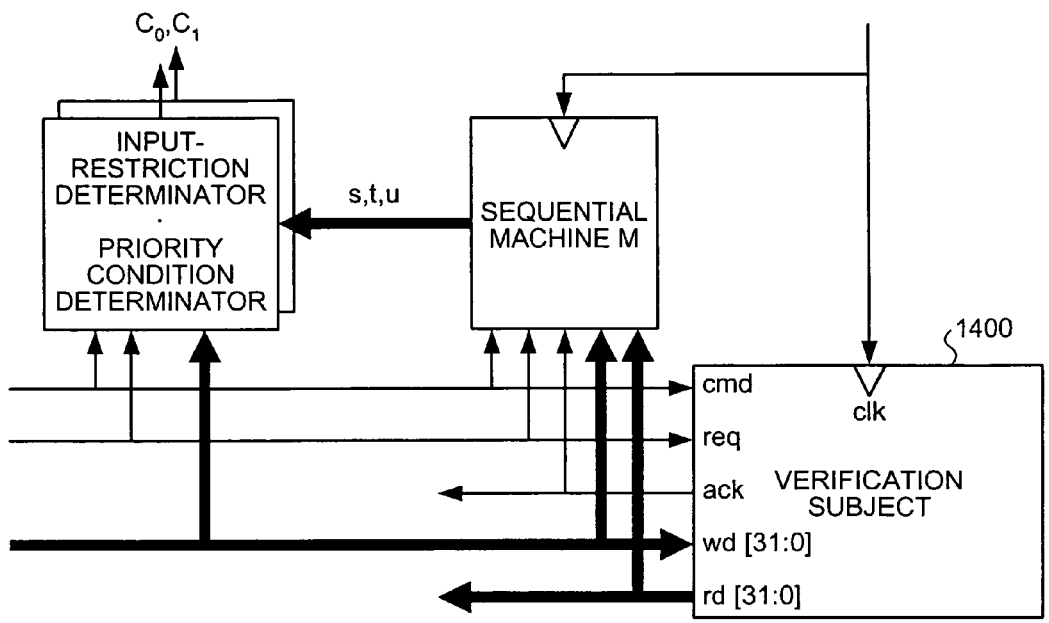
FIG. 7 is a schematic of a model defining an input-restriction condition ($C_0$) and a priority condition ($C_1$) according to a first example.

When the priority condition ($C_1$) is expressed by the logical expression $C_1$, a model in FIG. 7 is used as a supplementation. FIG. 7 is a schematic of a model defining the input-restriction condition ($C_0$) and the priority condition ($C_1$) according to the first example. A sequential machine M is the above-described sequential machine $M_0$ to which a new state variable u is added. Next, a state transition graph of the state variable u is shown.

Figure 8:
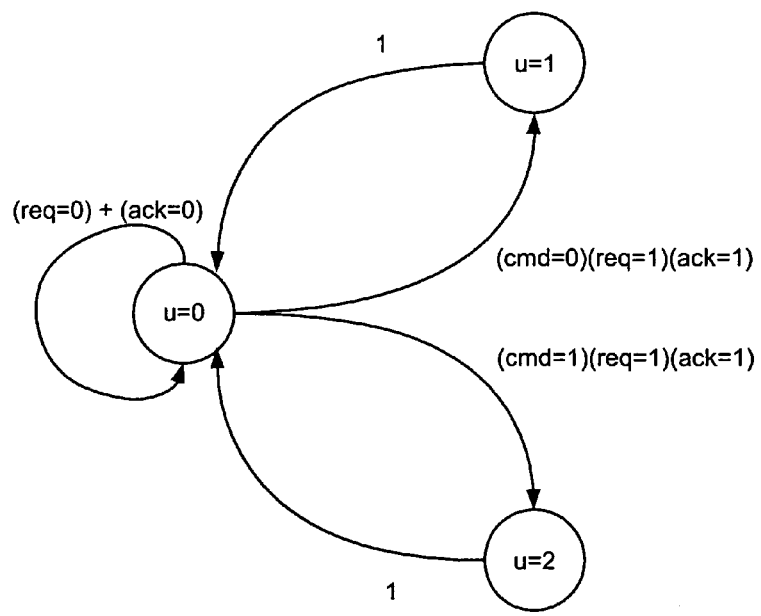
FIG. 8 is a schematic of a state transition graph of a state variable u.

FIG. 8 is a schematic of the state transition graph of the state variable u. u=0 corresponds to an initial state. u=1 corresponds to a state immediately after a completion of a first Read operation. u=2 corresponds to a state immediately after a completion of a first Write operation.

The state in which the Read operation or the Write operation is consecutively generated twice with no interval in between can be expressed by a following logical expression $P_1$, using the model.

$$P_1 = (u=1) \cdot \overline{cmd} \cdot req + (u=2) \cdot cmd \cdot req \qquad (31)$$

An actual priority condition ($C_1$) satisfies both the logical expression $P_1$ and the input-restriction condition ($C_0$). The input-restriction condition ($C_0$) is an implied condition. The priority condition ($C_1$) is expressed by Equation 32.

$$C_1 = P_1 \cdot C_0 \tag{32}$$

$$= ((u=1) \cdot \overline{cmd} \cdot req + (u=2) \cdot cmd \cdot req) \cdot ((s=0) +$$

$$(s=1) \cdot \overline{cmd} \cdot req + (s=2) \cdot cmd \cdot req \cdot (wd=t))$$

$$= (s=0) \cdot (u=1) \cdot \overline{cmd} \cdot req + (s=1) \cdot (u=1) \cdot \overline{cmd} \cdot$$

$$req + (s=0) \cdot (u=2) \cdot cmd \cdot req +$$

$$(s=2) \cdot (u=2) \cdot cmd \cdot req \cdot (wd=t)$$

A priority pattern selection condition ($S_1$) corresponding to the priority condition ($C_1$) is determined as follows.

$$S_1 = \exists (cmd, req, wd) \cdot C_1 \tag{33}$$

$$= (s=0) \cdot (u=1) + (s=1) \cdot (u=1) + (s=0) \cdot (u=2) +$$

$$(s=2) \cdot (u=2)$$

The basic pattern generator ($G_0$) is generated from the input-restriction condition ($C_0$) and the priority pattern generator ($G_1$) is generated from the priority condition ($C_1$), using the conventional technology, such as that in "Constraint Synthesis for Environment Modeling in Functional Verification". The operation of the basic pattern generator ($G_0$) acquired as a result is expressed by Equations 2 to 4.

On the other hand, an operation of the priority pattern generator (G1) is expressed by a following logical expression.

$$cmd \leftarrow ((s=0) \cdot (u=1) + (s=1) \cdot (u=1))?$$

$$:((s=0) \cdot (u=2) + (s=2) \cdot (u=2))?1:random(1) \tag{34}$$

$$req \leftarrow ((s=0) \cdot (u=1) + (s=1) \cdot (u=1) + (s=0) \cdot (u=2) + (s=2) \cdot (u=2))?$$

$$:random(1) \tag{35}$$

$$wd \leftarrow ((s=2) \cdot (u=2))?t:random(32) \tag{36}$$

The pattern generator (G) with priority condition is generated by the combination of the priority pattern selection condition (S1), the priority pattern generator (G1), and the basic pattern generator ($G_0$), and the addition of the selector circuits.

Figure 9:
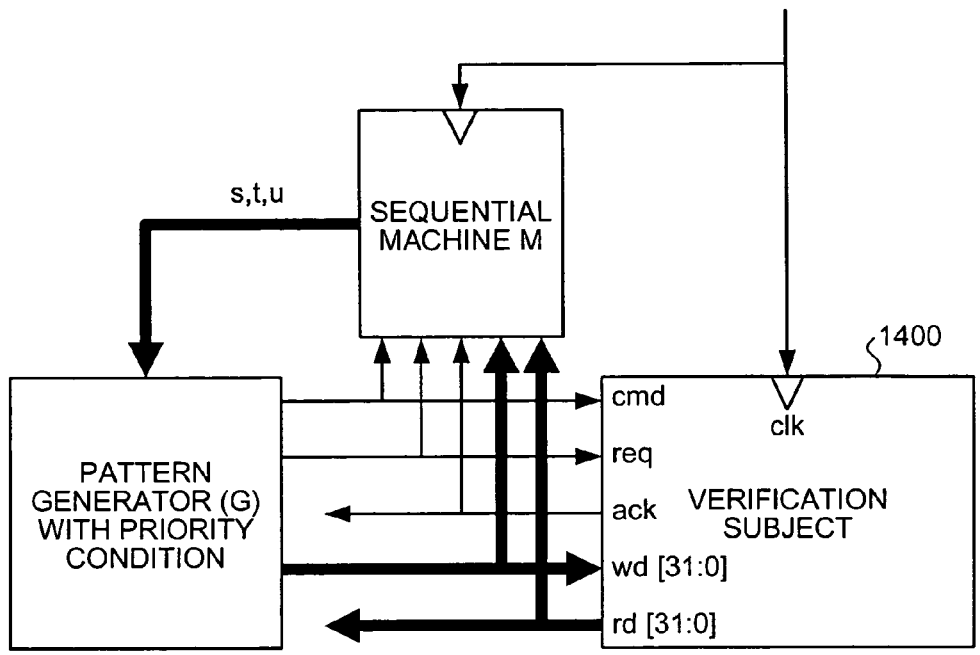
FIG. 9 is a schematic of a pattern generator (G) constructed by the constructing unit.
Figure 10:
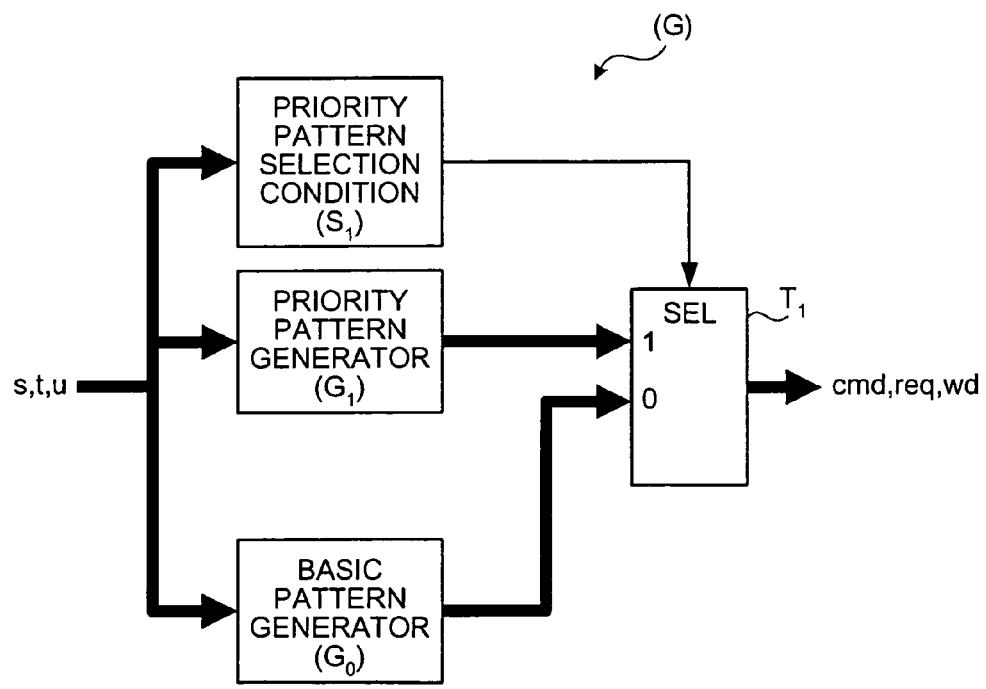
FIG. 10 is a schematic of an internal configuration of the constructed pattern generator (G)

FIG. 9 is a schematic of the pattern generator (G) constructed by the constructing unit 203. FIG. 10 is a schematic of an internal configuration of the constructed pattern generator (G). A selector circuit T1 selects an output of the priority pattern generator (G1) when the priority pattern selection condition (S1) is 1. The selector circuit T1 selects an output of the basic pattern generator (G0) when the priority pattern selection condition (S1) is 0.

According to the pattern generator (G) with priority condition in the first example, because the priority condition ($C_1$) is expressed by the logical expression, the patterns can be placed in sequence so that a pattern that applies to the priority condition ($C_i$) is tested precedingly to other patterns, and the other patterns are tested in subsequent stages.

When the sequencing function is used, the basic functions can be tested at an early stage and the situations in which problems tend to occur can be intensively tested. As a result, the efficiency of the logic verification operation can be significantly enhanced. The process for generating the pattern generator is divided into processes for the input-restriction condition and the priority condition. Therefore, the cost of calculator memory usage and the like can be reduced.

A second example is when a process for generating the pattern generator is performed using multiple priority conditions. The second example is explained using the first example. In the second example, a following priority condition is further added to the first example.

[Priority condition ($C_2$)] restriction in which the value of wd increases by one.

A new state variable is not required to be added for the priority condition ($C_2$). The priority condition ($C_2$) can be expressed by a following logical expression $P_2$.

$$P_2 = (wd = t+1) \tag{37}$$

A symbol "+" in Equation 37 is an addition symbol indicating that the value of wd increases by one. An actual priority condition ($C_2$) satisfies both the logical expression $P_2$ and the input-restriction condition ($C_0$). The input-restriction condition ($C_0$) is an implied condition. The priority condition ($C_2$) is expressed by Equation 38.

$$C_2 = P_2 \cdot C_0 \tag{38}$$

$$= (wd = t+1) \cdot ((s=0) + (s=1) \cdot \overline{cmd} \cdot req + (s=2) \cdot$$

$$cmd \cdot req \cdot (wd=t))$$

$$= (s=0) \cdot (wd = t+1) + (s=1) \cdot \overline{cmd} \cdot req \cdot (wd = t+1)$$

A priority pattern selection condition ($S_2$) corresponding to the priority condition (C2) is determined as follows.

$$S_2 = \exists (cmd, req, wd) \cdot C_2 = (s=0) + (s=1) \tag{39}$$

An operation of a priority pattern generator ($G_2$) generated from the priority condition ($C_2$) is as follows.

$$cmd \leftarrow (s=1)?0:random(1) \tag{40}$$

$$req \leftarrow (s=1)?1:random(1) \tag{41}$$

$$wd \leftarrow ((s=0) + (s=1)?t+1:random(32) \tag{42}$$

A pattern generator (G') corresponding to the two priority conditions ($C_1$) and ($C_2$) is configured by a combination of the priority pattern generator (G2) and the priority pattern selection condition ($S_2$), and the priority pattern selection condition (S1), the priority pattern generator ($G_1$), and the basic pattern generator ($G_0$).

Figure 11:
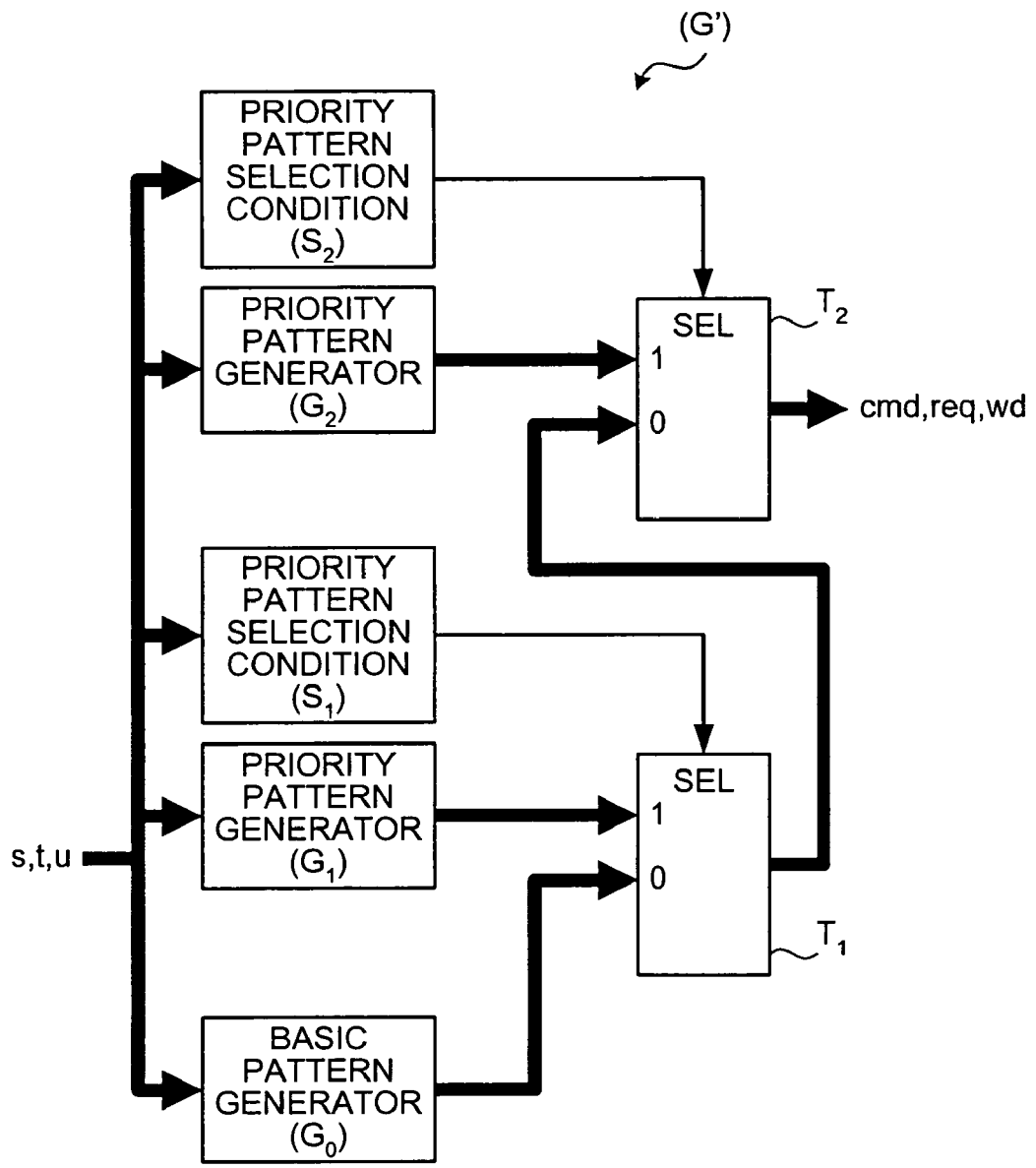
FIG. 11 is a schematic of an internal configuration of a pattern generator (G') corresponding to priority conditions ($C_1$) and ($C_2$)

FIG. 11 is a schematic of an internal configuration of the pattern generator (G') corresponding to the priority conditions ($C_1$) and ($C_2$). The patterns are used in an order of priority, from the priority condition ($C_2$) to the priority condition ($C_1$). The order of priority can be easily reversed by connections of the selector circuits $T_1$ and $T_2$ being changed.

A new priority condition ($C_3$) can be created using a logical product of the priority conditions ($C_1$) and ($C_2$). The priority condition ($C_3$) means that the two priority conditions ($C_1$) and ($C_2$) are simultaneously met. A pattern generator with priority condition for the three priority conditions ($C_1$) to ($C_3$) can be generated. The priority condition ($C_3$) is expressed by Equation 43.

$$C3 = C_1 \cdot C_2 \tag{43}$$

$$= (s=0) \cdot (u=1) \cdot \overline{cmd} \cdot req \cdot (wd = t+1) +$$

$$(s=1) \cdot (u=1) \cdot \overline{cmd} \cdot req \cdot (wd = t+1) +$$

$$(s=0) \cdot (u=2) \cdot cmd \cdot req \cdot (wd = t+1)$$

A priority pattern selection condition ($S_3$) corresponding to the priority condition ($C_3$) is determined as follows:

$$S_3 = \exists (cmd, req, wd) \cdot C_3 \quad (44)$$
$$= (s=0) \cdot (u=1) + (s=1) \cdot (u=1) +$$
$$(s=0) \cdot (u=2) + (s=2) \cdot (u=2)$$

An operation of a priority pattern generator ($G_3$) generated from the priority condition ($C_3$) is as follows.

$$cmd \leftarrow ((s=0) \cdot (u=1) + (s=1) \cdot (u=1)) \quad (45)$$
$$?0:((s=0) \cdot (u=2) + (s=2) \cdot (u=2))?1:\text{random} (1)$$

$$req \leftarrow ((s=0) \cdot (u=1) + (s=1) \cdot (u=1) + (s=0) \cdot (u=2) + \quad (46)$$
$$(s=2) \cdot (u=2))?1:\text{random} (1)$$

$$wd \leftarrow ((s=2) \cdot (u=2))?t:((s=0) \cdot (u=1) + (s=1) \cdot (u=1) + \quad (47)$$
$$(s=0) \cdot (u=2))?(t+1):\text{random} (32)$$

If the priority condition ($C_3$) is given the highest priority at this time, a pattern generator that first finds a pattern simultaneously satisfying the two priority conditions ($C_1$) and ($C_2$), then finds patterns individually satisfying the priority conditions ($C_1$) and ($C_2$) can be actualized.

According to the second example, same effects as those by the first example can be achieved. Functions of each component indicated in the pattern generator (G') are clearly separated, and can be reused by changing the order of priority by changing the configuration of the selector circuits automatically or manually.

In the first embodiment, an example is explained in which the pattern generator (G) with priority condition is constructed using the logical expression $C_0$, the logical expression $C_k$, and the logical expression $S_k$. The logical expression $C_0$ expresses the input-restriction condition ($C_0$). The logical expression $C_k$ expresses the priority condition ($C_k$). The logical expression $S_k$ expresses the priority pattern selection condition ($S_k$). However, in a second embodiment, an example is explained in which the pattern generator (G) is constructed using a logical expression C and using the logical expression $C_0$, the logical expression $C_k$, and the logical expression $S_k$. In the logical expression C, the input-restriction condition ($C_0$) and the priority condition ($C_k$) are integrated in advance. The logical expression $C_0$ expresses the input-restriction condition ($C_0$). The logical expression $C_k$ expresses the priority condition ($C_k$). The logical expression $S_k$ expresses the priority pattern selection condition ($S_k$).

In the second embodiment, the hardware configuration shown in FIG. 1 is used. Therefore, an explanation thereof is omitted. Contents that are the same as that explained in the first embodiment are given the same reference numbers. Therefore, explanations thereof are omitted.

Figure 12:
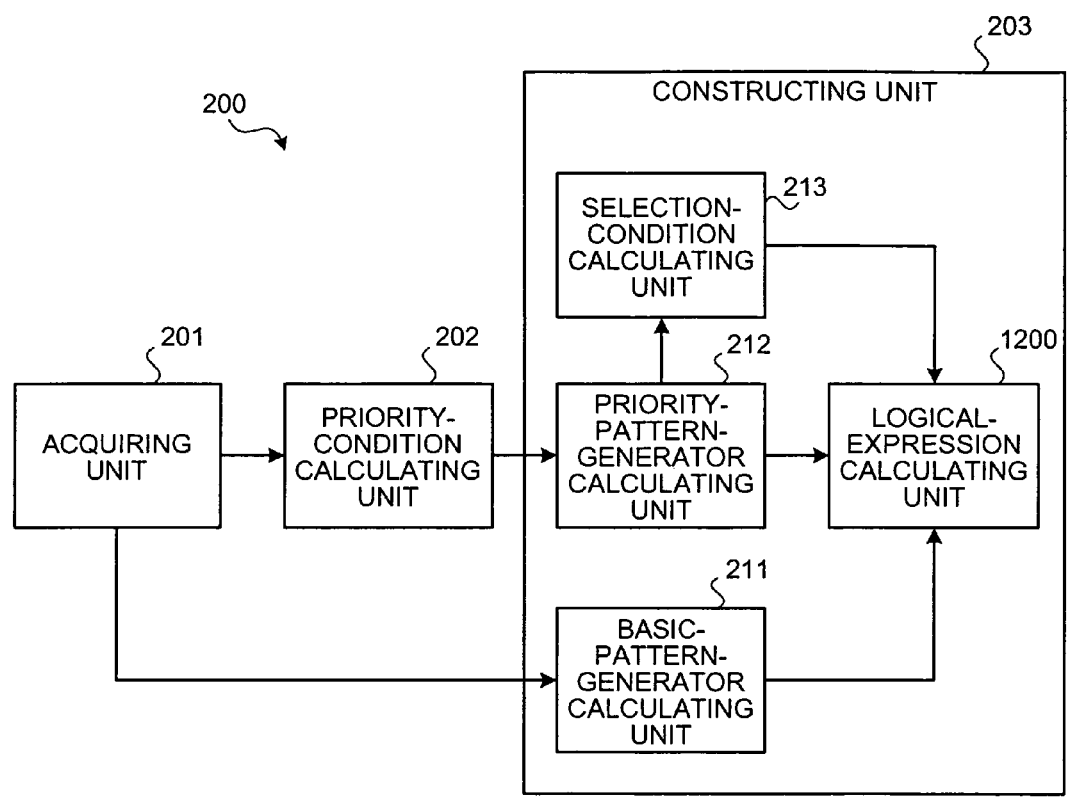
FIG. 12 is a block diagram of the verification support device according to a second embodiment of the present invention.

FIG. 12 is a functional block diagram of a verification support device 200 according to the second embodiment. A logical-expression calculating unit 1200 calculates a restriction with priority condition logical expression C, based on the logical expression $C_0$, the logical expression $C_k$, and the logical expression $S_k$. The restriction with priority condition logical expression C satisfies the input-restriction condition ($C_0$) and the priority condition ($C_k$). The logical expression $C_0$ expresses the input-restriction condition ($C_0$). The logical expression $C_k$ expresses the priority condition ($C_k$). The logical expression $S_k$ expresses the priority pattern selection condition ($S_k$). Specifically, the restriction with priority condition logical expression C is calculated using a following equation.

$$C = S_k \cdot C_k + \overline{S_k} \cdot C_0 \quad (48)$$

Specifically, functions of the logical-expression calculating unit 1200 are actualized by the CPU 101 executing a program recorded on, for example, the ROM 102, the RAM 103, the HD 105, or the FD 107, shown in FIG. 1. Alternatively, the functions are actualized by the I/F 109.

Figure 13:
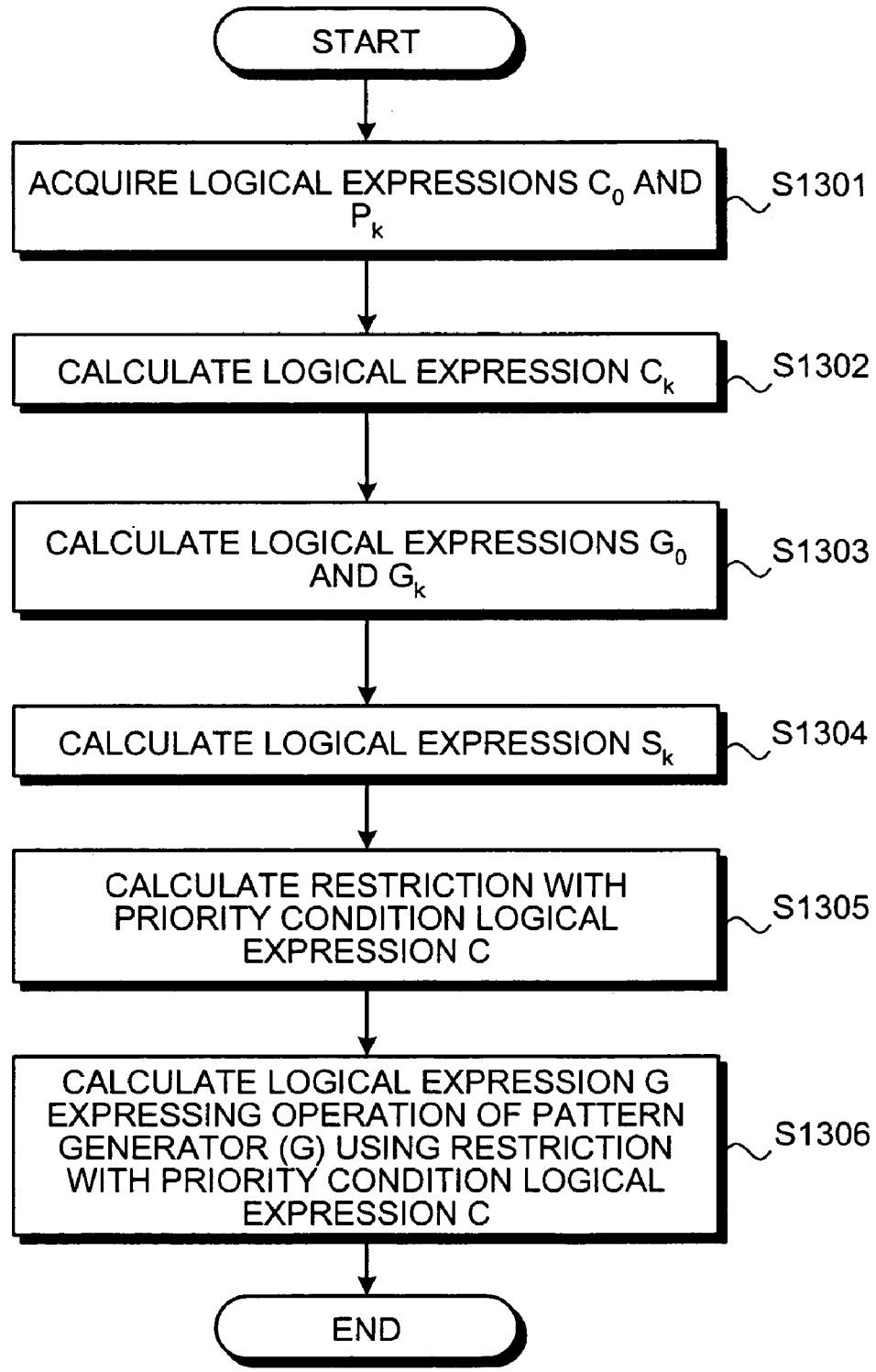
FIG. 13 is a flowchart of a verification support process performed by the verification support device according to the second embodiment.

FIG. 13 is a flowchart of a verification support process performed by the verification support device 200 according to a second embodiment of the present invention. First, the acquiring unit 201 acquires the logical expression $C_0$ and the logical expression $P_k$ (Step S1301). The logical expression $C_0$ expresses the input-restriction condition ($C_0$). The logical expression $P_k$ expresses the priority verification action ($P_k$). Next, the priority-condition calculating unit 202 calculates the logical expression $C_k$ using the logical expression $P_k$ (Step S1302). The logical expression $C_k$ expresses the priority condition ($C_k$).

Then, the basic-pattern-generator calculating unit 211 calculates the logical expression $G_0$ using the logical expression $C_0$. In addition, the priority-pattern-generator calculating unit 212 calculates the logical expression $G_k$ using the logical expression $C_k$ (Step S1303). The logical expression $G_0$ expresses the operation of the basic pattern generator ($G_0$). The logical expression $G_k$ expresses the operation of the priority pattern generator ($G_k$).

The selection-condition calculating unit 213 calculates the logical expression $S_k$ using the logical expression $C_k$ (Step S1304). The logical expression $S_k$ expresses the priority pattern selection condition ($S_k$). Then, the logical-expression calculating unit 1200 calculates a single restriction with priority condition logical expression C, using the logical expressions G0, $G_k$, and $S_k$ (Step S1305). In the restriction with priority condition logical expression C, the logical expressions G0 and $G_k$ are integrated. The restriction with priority condition logical expression C becomes the logical expression expressing the operation of the pattern generator (G) with priority condition.

In this way, according to the second embodiment, the input-restriction condition ($C_0$) and all priority conditions ($C_k$) can be integrated, and a single logical expression can be acquired. Because the pattern generator generating process is performed after the input-restriction condition ($C_0$) and all priority conditions ($C_k$) are integrated into one logical expression, an optimization process can be facilitated. The optimization process reduces a scale of the generated pattern generator (G).

The basic pattern generator ($G_0$) and the priority pattern generator ($G_1$) are respectively generated in the first example. However, in a third example, the restriction with priority condition logical expression C is generated. In the restriction with priority condition logical expression C, the input-restriction condition ($C_0$) and the priority conditions (C1) are integrated. Then, based on the restriction with priority condition logical expression C, the pattern generator (G) is generated using the conventional technology in "Constraint Synthesis for Environment Modeling in Functional Verification".

The restriction with priority condition logical expression C can be determined as follows, using the priority pattern selection condition ($S_1$) determined in the first example.

$$C = S_1 \cdot C_1 + \overline{S_1} \cdot C_0 \quad (49)$$
$$= (u=0) \cdot (s=0) + (s=0) \cdot (u=1) \cdot \overline{cmd} \cdot req +$$
$$(s=0) \cdot (u=2) \cdot cmd \cdot req + (s=1) \cdot \overline{cmd} \cdot req +$$
$$(s=2) \cdot cmd \cdot req \cdot (wd=t)$$

An operation of the pattern generator (G) generated from the restriction with priority condition logical expression C is as follows:

$$cmd \leftarrow ((s=0) \cdot (u=1)+(s=1))?0:((s=0) \cdot (u=2)+(s=2))?1: \text{random}(1) \quad (50)$$

$$req \leftarrow ((s=0) \cdot (u=1)+(s=0) \cdot (u=2)+(s=1)+(s=2))?1:\text{random}(1) \quad (51)$$

$$wd \leftarrow (s=2)?t:\text{random}(32) \quad (52)$$

When there are two or three priority conditions such as in the second example, restriction with priority condition logical expressions C' and C" can be similarly determined. The restriction with priority condition logical expressions C' and C" are expressed by Equations 53 and 54.

$$\begin{aligned} C' &= S_2 \cdot C_2 + \overline{S_2} \cdot S_1 \cdot C_1 + \overline{S_2} \cdot \overline{S_1} \cdot C_0 \quad (53)\\ &= (s=0) \cdot (wd = t+1) + (s=1) \cdot \overline{cmd} \cdot req \cdot (wd = t+1) + \\ &\quad (s=2) \cdot cmd \cdot req \cdot (wd = t) \end{aligned}$$

$$\begin{aligned} C'' &= S_3 \cdot C_3 + \overline{S_3} \cdot S_2 \cdot C_2 + \overline{S_3} \cdot \overline{S_2} \cdot S_1 \cdot C_1 + \overline{S_3} \cdot \overline{S_2} \cdot \overline{S_1} \cdot C_0 \quad (54)\\ &= (s=0) \cdot (u=1) \cdot \overline{cmd} \cdot req \cdot (wd = t+1) + \\ &\quad (s=1) \cdot (u=1) \cdot \overline{cmd} \cdot req \cdot (wd = t+1) + \\ &\quad (s=0) \cdot (u=2) \cdot cmd \cdot req \cdot (wd = t+1) + \\ &\quad (s=2) \cdot (u=2) \cdot cmd \cdot req \cdot (wd = t) + \\ &\quad (s=0) \cdot (u=0) \cdot (wd = t+1) + \\ &\quad (s=1) \cdot (u=0) \cdot \overline{cmd} \cdot req \cdot (wd = t+1) + \\ &\quad (s=1) \cdot (u=2) \cdot \overline{cmd} \cdot req \cdot (wd = t+1) + \\ &\quad (s=2) \cdot (u=0) \cdot cmd \cdot req \cdot (wd = t) + \\ &\quad (s=2) \cdot (u=1) \cdot cmd \cdot req \cdot (wd = t) \end{aligned}$$

An operation of a pattern generator (G') generated by the restriction with priority condition logical expression C' is as follows:

$$cmd \leftarrow (s=1)?0:(s=2)?1:\text{random}(1) \quad (55)$$

$$req \leftarrow ((s=1)+(s=2))?1:\text{random}(1) \quad (56)$$

$$wd \leftarrow (s=2)?t:((s=0)+(s=1))?(t+1):\text{random}(32) \quad (57)$$

An operation of a pattern generator (G") generated by the restriction with priority condition logical expression C" is as follows.

$$cmd \leftarrow ((s=0) \cdot (u=1)+(s=1))?0((s=0) \cdot (u=1)+(s=2))?1: \text{random}(1) \quad (58)$$

$$req \leftarrow ((s=0) \cdot (u=1)+(s=0) \cdot (u=2)+(s=1)+(s=2))?1: \text{random}(1) \quad (59)$$

$$wd \leftarrow (s=2)?t:((s=0)+(s=1))?(t+1):\text{random}(32) \quad (60)$$

According to the third example, because a generating process for pattern generators (G) to (G") is performed after the input-restriction condition ($C_0$) and all priority conditions ($C_k$) are integrated into one logical expression, the optimization process can be facilitated. The optimization process reduces the scales of the generated pattern generators (G) to (G").

As explained above, in the verification support device according to the first and second embodiments, a particular situation can be targeted and tested, in addition to testing as wide a range of situations as possible. Therefore, the verification operation can be shortened and accuracy can be increased.

The verification support method explained in the embodiments can be actualized by an execution of a program by a computer, such as a personal computer or a work station. The program is provided in advance. The program is recorded on a recording medium that can be read by the computer, such as a hard disk, a flexible disk, a CD-ROM, an MO disk, or a DVD. The program is read out from the recording medium by the computer and executed. The program can also be a transmission medium that can be distributed via a network, such as the internet.

According to the present invention, a particular situation can be targeted and tested, while testing as wide range of situations as possible.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable recording medium that stores therein a verification support program making a computer execute:

acquiring a first logical expression expressing an input condition that an input to a verification subject is required to satisfy, and a second logical expression expressing a priority verification action that is selected with priority, from among verification actions for the verification subject;

calculating a third logical expression expressing a priority condition based on the first logical expression and the second logical expression, the third logical expression expressing that an input in the priority verification action that satisfies the input condition is desired to be input to the verification subject; and constructing a pattern generator that selectively generates a basic pattern and a priority pattern of an input to the verification subject based on the first logical expression and the third logical expression, the basic pattern satisfying the input condition, the priority pattern satisfying the priority condition.

2. The computer-readable recording medium according to claim 1, wherein the verification support program further makes the computer execute:

calculating a fourth logical expression expressing an operation of a basic pattern generator that generates the basic pattern, based on the first logical expression; and calculating a fifth logical expression expressing an operation of a priority pattern generator that generates the priority pattern, based on the third logical expression, and the constructing includes constructing the pattern generator based on the fourth logical expression and the fifth logical expression.

3. The computer-readable recording medium according to claim 1, wherein the verification support program further makes the computer execute acquiring, when a plurality of priority verification actions are present, information indicative of priority orders of the priority verification actions, and the constructing includes constructing the pattern generator so that the priority pattern is generated according to the priority orders.

4. The computer-readable recording medium according to claim 1, wherein the verification supporting program further makes the computer execute calculating, when a plurality of priority verification actions are present, a logical product of third logical expressions respectively corresponding to the priority verification actions, and the constructing includes constructing the pattern generator that selectively generates the basic pattern and priority patterns based on the first logical expression and the logical product.

5. The computer-readable recording medium according to claim 4, wherein the logical expression uses an input and an output of the verification subject and state variables of a finite state machine that makes a state transition corresponding to the input and the output; and the third logical expression uses an input group input into the verification subject and at least one of the output and a variable group of the state variables of the finite state machine.

6. The computer-readable recording medium according to claim 5, wherein the verification support program further makes the computer execute calculating, when the priority condition is satisfied, a sixth logical expression expressing a selection condition for the priority pattern specified by the variable group based on the third logical expression using the input group and the variable group, and the pattern generator selectively generates the basic pattern and the priority pattern according to a value of the sixth logical expression.

7. The computer-readable recording medium according to claim 5, wherein the verification support program further makes the computer execute:

calculating, when the priority condition is satisfied, a sixth logical expression expressing a selection condition for the priority pattern specified by the variable group based on the third logical expression using the input group and the variable group; and calculating a seventh logical expression that satisfies both the input condition and the priority condition, based on the first logical expression, the third logical expression, and the sixth logical expression, wherein the constructing includes constructing the pattern generator based on the seventh logical expression.

8. A verification support apparatus comprising:

a first acquiring unit configured to acquire a first logical expression expressing an input condition that an input to a verification subject is required to satisfy, and a second logical expression expressing a priority verification action that is selected with priority, from among verification actions for the verification subject;

a first calculating unit configured to calculate a third logical expression expressing a priority condition based on the first logical expression and the second logical expression, the third logical expression expressing that an input in the priority verification action that satisfies the input condition is desired to be input to the verification subject; and a constructing unit configured to construct a pattern generator that selectively generates a basic pattern and a priority pattern of an input to the verification subject based on the first logical expression and the third logical expression, the basic pattern satisfying the input condition, the priority pattern satisfying the priority condition.

9. The verification support apparatus according to claim 8, further comprising:

a second calculating unit configured to calculate a fourth logical expression expressing an operation of a basic pattern generator that generates the basic pattern, based on the first logical expression; and a third calculating unit configured to calculate a fifth logical expression expressing an operation of a priority pattern generator that generates the priority pattern, based on the third logical expression, wherein the constructing unit is configured to construct the pattern generator based on the fourth logical expression and the fifth logical expression.

10. The verification support apparatus according to claim 8, further comprising a second acquiring unit configured to acquire, when a plurality of priority verification actions are present, information indicative of priority orders of the priority verification actions, wherein the constructing unit is configured to construct the pattern generator so that the priority pattern is generated according to the priority orders.

11. The verification support apparatus according to claim 8, further comprising a fourth calculating unit configured to calculate, when a plurality of priority verification actions are present, a logical product of third logical expressions respectively corresponding to the priority verification actions, wherein the constructing unit is configured to construct the pattern generator that selectively generates the basic pattern and priority patterns based on the first logical expression and the logical product.

12. The verification support apparatus according to claim 11, wherein the logical expression uses an input and an output of the verification subject and state variables of a finite state machine that makes a state transition corresponding to the input and the output; and the third logical expression uses an input group input into the verification subject and at least one of the output and a variable group of the state variables of the finite state machine.

13. The verification support apparatus according to claim 12, further comprising a fifth calculating unit configured to calculate, when the priority condition is satisfied, a sixth logical expression expressing a selection condition for the priority pattern specified by the variable group based on the third logical expression using the input group and the variable group, wherein the pattern generator selectively generates the basic pattern and the priority pattern according to a value of the sixth logical expression.

14. A verification support method comprising:

acquiring a first logical expression expressing an input condition that an input to a verification subject is required to satisfy, and a second logical expression expressing a priority verification action that is selected with priority, from among verification actions for the verification subject;

calculating a third logical expression expressing a priority condition based on the first logical expression and the second logical expression, the third logical expression expressing that an input in the priority verification action that satisfies the input condition is desired to be input to the verification subject; and constructing a pattern generator that selectively generates a basic pattern and a priority pattern of an input to the verification subject based on the first logical expression and the third logical expression, the basic pattern satisfying the input condition, the priority pattern satisfying the priority condition.

15. The verification support method according to claim 14, further comprising:
calculating a fourth logical expression expressing an operation of a basic pattern generator that generates the basic pattern, based on the first logical expression; and
calculating a fifth logical expression expressing an operation of a priority pattern generator that generates the priority pattern, based on the third logical expression, wherein
the constructing includes constructing the pattern generator based on the fourth logical expression and the fifth logical expression.

16. The verification support method according to claim 14, further comprising acquiring, when a plurality of priority verification actions are present, information indicative of priority orders of the priority verification actions, wherein
the constructing includes constructing the pattern generator so that the priority pattern is generated according to the priority orders.

17. The verification support method according to claim 14, further comprising calculating, when a plurality of priority verification actions are present, a logical product of third logical expressions respectively corresponding to the priority verification actions, wherein
the constructing includes constructing the pattern generator that selectively generates the basic pattern and priority patterns based on the first logical expression and the logical product.

18. The verification support method according to claim 17, wherein
the logical expression uses an input and an output of the verification subject and state variables of a finite state machine that makes a state transition corresponding to the input and the output; and
the third logical expression uses an input group input into the verification subject and at least one of the output and a variable group of the state variables of the finite state machine.

19. The verification support method according to claim 18 further comprising calculating, when the priority condition is satisfied, a sixth logical expression expressing a selection condition for the priority pattern specified by the variable group based on the third logical expression using the input group and the variable group, wherein
the pattern generator selectively generates the basic pattern and the priority pattern according to a value of the sixth logical expression.

* * * * *